US012707763B2

(12) United States Patent
Kim et al.

(10) Patent No.: US 12,707,763 B2
(45) Date of Patent: Aug. 11, 2026

(54) LIGHT EMITTING ELEMENT AND DISPLAY DEVICE INCLUDING THE SAME

(71) Applicant: Samsung Display Co., LTD., Yongin-si (KR)

(72) Inventors: Si Sung Kim, Seoul (KR); Hyun Min Cho, Seoul (KR); Hyung Seok Kim, Hwaseong-si (KR); Jong Jin Lee, Seongnam-si (KR); Dong Eon Lee, Hwaseong-si (KR)

(73) Assignee: Samsung Display Co., Ltd, Yongin-si (KR)

(*) Notice: Subject to any disclaimer, the term of this patent is extended or adjusted under 35 U.S.C. 154(b) by 745 days.

(21) Appl. No.: 17/894,894

(22) Filed: Aug. 24, 2022

(65) Prior Publication Data

US 2023/0073501 A1 Mar. 9, 2023

(30) Foreign Application Priority Data

Aug. 30, 2021 (KR) ........................ 10-2021-0114856

(51) Int. Cl.
*H10H 20/821* (2025.01)
*H10H 20/01* (2025.01)
(Continued)

(52) U.S. Cl.
CPC ........ *H10H 20/821* (2025.01); *H10H 20/018* (2025.01); *H10H 20/84* (2025.01); *H10H 29/142* (2025.01)

(58) Field of Classification Search
CPC . H01L 25/0753; H01L 25/167; H10H 20/018; H10H 20/819; H10H 20/821; H10H 20/84; H10H 29/142
See application file for complete search history.

(56) References Cited

U.S. PATENT DOCUMENTS 9,362,717 B2 6/2016 Kikuchi et al.
9,583,671 B2 2/2017 Wang et al.
(Continued)

FOREIGN PATENT DOCUMENTS

JP 5416826 B2 2/2014
JP 2017-183462 A 10/2017
(Continued)

OTHER PUBLICATIONS

Eriguchi (2017) "Modeling of defect generation during plasma etching and its impact on electronic device performance—plasma-induced damage," Journal of Physics D: Applied Physics, 25pp.
(Continued)

*Primary Examiner* — Matthew C Landau
*Assistant Examiner* — Dmitriy Yemelyanov
(74) *Attorney, Agent, or Firm* — Womble Bond Dickinson (US) LLP

(57) ABSTRACT

A light emitting element includes a first semiconductor layer, a second semiconductor layer on the first semiconductor layer, and an element active layer between the first semiconductor layer and the second semiconductor layer. The first semiconductor layer, the element active layer, and the second semiconductor layer are sequentially located along a first direction. A thickness of the first semiconductor layer in the first direction is greater than a thickness of the second semiconductor layer in the first direction. A cross section of the element active layer taken along the first direction includes a first side facing the first semiconductor layer, a second side facing the second semiconductor layer, a first lateral side connecting one end of the first side to one end of the second side, and a second lateral side connecting an other end of the first side to an other end of the second side.

13 Claims, 27 Drawing Sheets

(51) Int. Cl.
*H10H 20/84* (2025.01)
*H10H 29/14* (2025.01)

(56) References Cited

U.S. PATENT DOCUMENTS

| | | | | |
|---|---|---|---|---|
| 10,910,512 | B2 | 2/2021 | Sung | |
| 11,302,562 | B2 | 4/2022 | Wang | |
| 12,224,384 | B2 | 2/2025 | An et al. | |
| 2012/0119237 | A1* | 5/2012 | Leatherdale ......... | H10H 29/142<br>257/E33.006 |
| 2016/0254138 | A1 | 9/2016 | Kikuchi et al. | |
| 2017/0317228 | A1* | 11/2017 | Sung ...................... | H10H 20/84 |
| 2021/0151624 | A1 | 5/2021 | Sung | |

FOREIGN PATENT DOCUMENTS

| | | | |
|---|---|---|---|
| KR | 2006-0125079 | | 12/2006 |
| KR | 10-0717276 | B1 | 5/2007 |
| KR | 10-0720101 | B1 | 5/2007 |
| KR | 10-1227724 | | 1/2013 |
| KR | 2016-0059576 | | 5/2016 |
| KR | 10-1674052 | B1 | 11/2016 |
| KR | 10-2100749 | | 4/2020 |
| KR | 2020-0145951 | A | 12/2020 |
| WO | WO 2020/199771 | A1 | 10/2020 |
| WO | WO 2021-002599 | | 1/2021 |

OTHER PUBLICATIONS

International Search Report dated Dec. 2, 2022 for corresponding PCT Application No. PCT/KR2022/012871 (3 pages).

Written Opinion Report dated Dec. 2, 2022 for corresponding PCT Application No. PCT/KR2022/012871 (4 pages).

* cited by examiner

LIGHT EMITTING ELEMENT AND DISPLAY DEVICE INCLUDING THE SAME

CROSS-REFERENCE TO RELATED APPLICATION

This application claims priority to and the benefit of Korean Patent Application No. 10-2021-0114856 filed on Aug. 30, 2021, in the Korean Intellectual Property Office (KIPO), the entire content of which is incorporated by reference herein.

BACKGROUND

1. Field

Aspects and features of one or more embodiments of the present disclosure relate to a light emitting element and a display device including the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The display panel may include a light emitting element, and the light emitting element may be a light emitting diode (LED). The light emitting diode includes an organic light emitting diode (OLED) that uses an organic material as a light emitting material, and an inorganic light emitting diode that uses an inorganic material as a light emitting material.

SUMMARY

Aspects and features of one or more embodiments of the present disclosure provide a light emitting element with improved luminous efficiency by efficiently removing a surface defect of an element active layer generated during a manufacturing process of the light emitting element, by forming the element active layer in such a way that the exterior angle of the side surface of at least a part of the element active layer with respect to the bottom surface of the element active layer may be included in the range of 55° to 75° or 57° to 73°, and in one or more embodiments in the range of 60° to 73°.

Aspects and features of one or more embodiments of the present disclosure also provide a display device having improved display quality by including a light emitting element formed in such a way that the exterior angle of the side surface of at least a part of an element active layer with respect to the bottom surface of the element active layer may be included in the range of 55° to 75° or 57° to 73°, and in one or more embodiments in the range of 60° to 73°.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a light emitting element including a first semiconductor layer, a second semiconductor layer on the first semiconductor layer, and an element active layer between the first semiconductor layer and the second semiconductor layer. The first semiconductor layer, the element active layer, and the second semiconductor layer are sequentially located along a first direction. A thickness of the first semiconductor layer in the first direction is greater than a thickness of the second semiconductor layer in the first direction. A cross section of the element active layer taken along the first direction includes a first side facing the first semiconductor layer, a second side facing the second semiconductor layer, a first lateral side connecting one end of the first side to one end of the second side, and a second lateral side connecting an other end of the first side to the an end of the second side. A length of the second side is longer than a length of the first side. An exterior angle between the first side and the first lateral side is in a range of 55° to 75°.

According to one or more embodiments, an exterior angle between the first side and the second lateral side may be in a range of 55° to 75°.

According to one or more embodiments, the exterior angle between the first side and the first lateral side may be in a range of 60° to 73°. The size of the exterior angle between the first side and the second lateral side may be in a range of 60° to 73°.

According to one or more embodiments, the exterior angle between the first side and the first lateral side and the exterior angle between the first side and the second lateral side may be the same.

According to one or more embodiments, each of the first lateral side and the second lateral side may be inclined with respect to the first side. A direction in which the first lateral side is inclined and a direction in which the second lateral side is inclined may be opposite to each other.

According to one or more embodiments, the cross section of the element active layer may be asymmetrical with respect to a reference line extending in the first direction passing through a central portion of the element active layer.

According to one or more embodiments, the first side and the second lateral side may be perpendicular to each other.

According to one or more embodiments, the thickness of the first semiconductor layer in the first direction may be greater than a thickness of the element active layer in the first direction.

According to one or more embodiments, the thickness of the first semiconductor layer in the first direction may be greater than a sum of the thickness of the element active layer in the first direction and the thickness of the second semiconductor layer in the first direction.

According to one or more embodiments of the present disclosure, there is provided a light emitting element including a first semiconductor layer, a second semiconductor layer on the first semiconductor layer, and an element active layer between the first semiconductor layer and the second semiconductor layer. A diameter of the element active layer increases from the first semiconductor layer toward the second semiconductor layer. The element active layer includes a first surface facing the first semiconductor layer, a second surface opposite to the first surface and facing the second semiconductor layer, and a side surface connecting the first surface to the second surface. The side surface of the element active layer includes a first region inclined with respect to the first surface and a second region perpendicular to the first surface.

According to one or more embodiments, an acute angle between the first surface and the first region of the side surface may be in a range of 55° to 75°.

According to one or more embodiments, the first semiconductor layer may extend in a first direction. The first semiconductor layer, the element active layer, and the second semiconductor layer may be sequentially located along the first direction.

According to one or more embodiments, a thickness of the first semiconductor layer in the first direction may be greater than a thickness of the second semiconductor layer in the first direction.

According to one or more embodiments, the thickness of the first semiconductor layer in the first direction may be greater than twice the thickness of the second semiconductor layer in the first direction.

According to one or more embodiments, the thickness of the first semiconductor layer in the first direction may be greater than a thickness of the element active layer in the first direction.

According to one or more embodiments, the thickness of the first semiconductor layer in the first direction may be greater than a sum of the thickness of the element active layer in the first direction and the thickness of the second semiconductor layer in the first direction.

According to one or more embodiments of the present disclosure, there is provided a display device including a first electrode and a second electrode on a substrate and spaced from each other, and a light emitting element between the first electrode and the second electrode and extending in a first direction. The light emitting element includes a first semiconductor layer, a second semiconductor layer on the first semiconductor layer, and an element active layer between the first semiconductor layer and the second semiconductor layer. The first semiconductor layer, the element active layer, and the second semiconductor layer are sequentially located along the first direction. A thickness of the first semiconductor layer in the first direction is greater than a thickness of the second semiconductor layer in the first direction. A cross section of the element active layer taken along the first direction includes a first side facing the first semiconductor layer, a second side facing the second semiconductor layer, a first lateral side connecting one end of the first side to one end of the second side, and a second lateral side connecting an other end of the first side to an other end of the second side. A length of the second side is greater than a length of the first side. An exterior angle between the first side and the first lateral side or the second lateral side is in a range of 55° to 75°.

According to one or more embodiments, each of the first lateral side and the second lateral side may be inclined with respect to the first side. A direction in which the first lateral side is inclined and a direction in which the second lateral side is inclined may be opposite to each other.

According to one or more embodiments, the cross section of the element active layer may be asymmetrical with respect to a reference line extending in the first direction passing through a central portion of the element active layer.

According to one or more embodiments, the first side and the second lateral side may be perpendicular to each other.

According to the aforementioned and other embodiments of the present disclosure, the exterior angle of the side surface of at least a part of the element active layer with respect to the bottom surface of the element active layer may be in the range of 55° to 75° or 57° to 73°, and in one or more embodiments may be in the range of 60° to 73°, so that a surface defect of the element active layer generated during the manufacturing process of the light emitting element may be efficiently removed, thereby improving the luminous efficiency of the light emitting element.

According to the aforementioned and other embodiments of the present disclosure, the display device may include the light emitting element having improved element efficiency and reliability, thereby improving the display quality of the display device.

However, the effects, aspects, and features of the present disclosure are not limited to the aforementioned effects, aspects, and features and various other effects, aspects, and features are included in the present specification.

BRIEF DESCRIPTION OF THE DRAWINGS

The above and other embodiments and features of embodiments according to the present disclosure will become more apparent by describing aspects of some embodiments thereof with reference to the attached drawings, in which:

FIG. 5 is a plan view illustrating a relative planar arrangement between a first surface and a second surface of an element active layer included in the light emitting element of FIG. 1 according to one or more embodiments;

DETAILED DESCRIPTION

Figure 1:
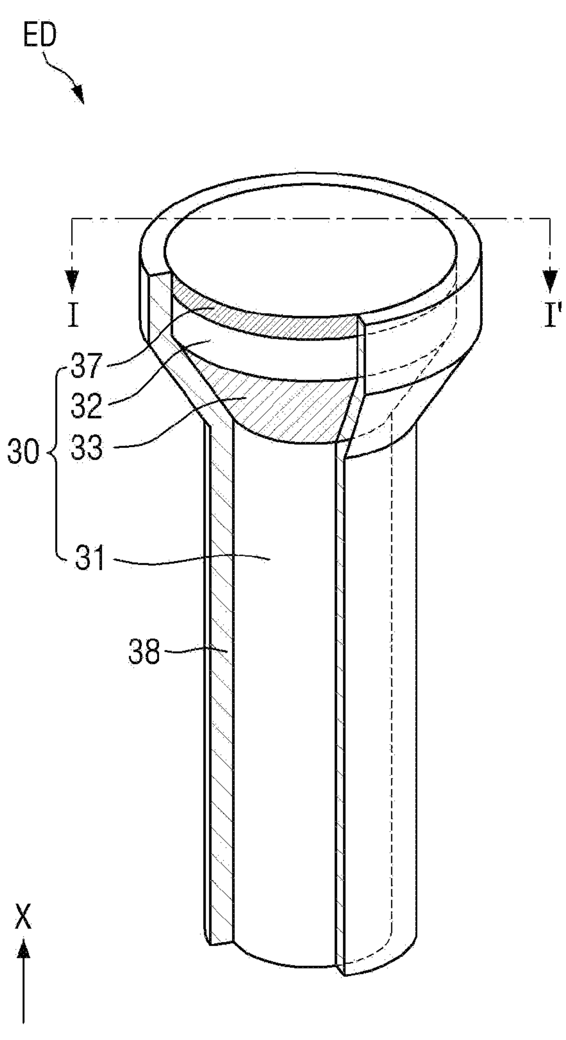
FIG. 1 is a schematic perspective cutaway view of a light emitting element according to one or more embodiments.

Aspects and features of one or more embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present.

For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof.

Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to one or more embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of one or more embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
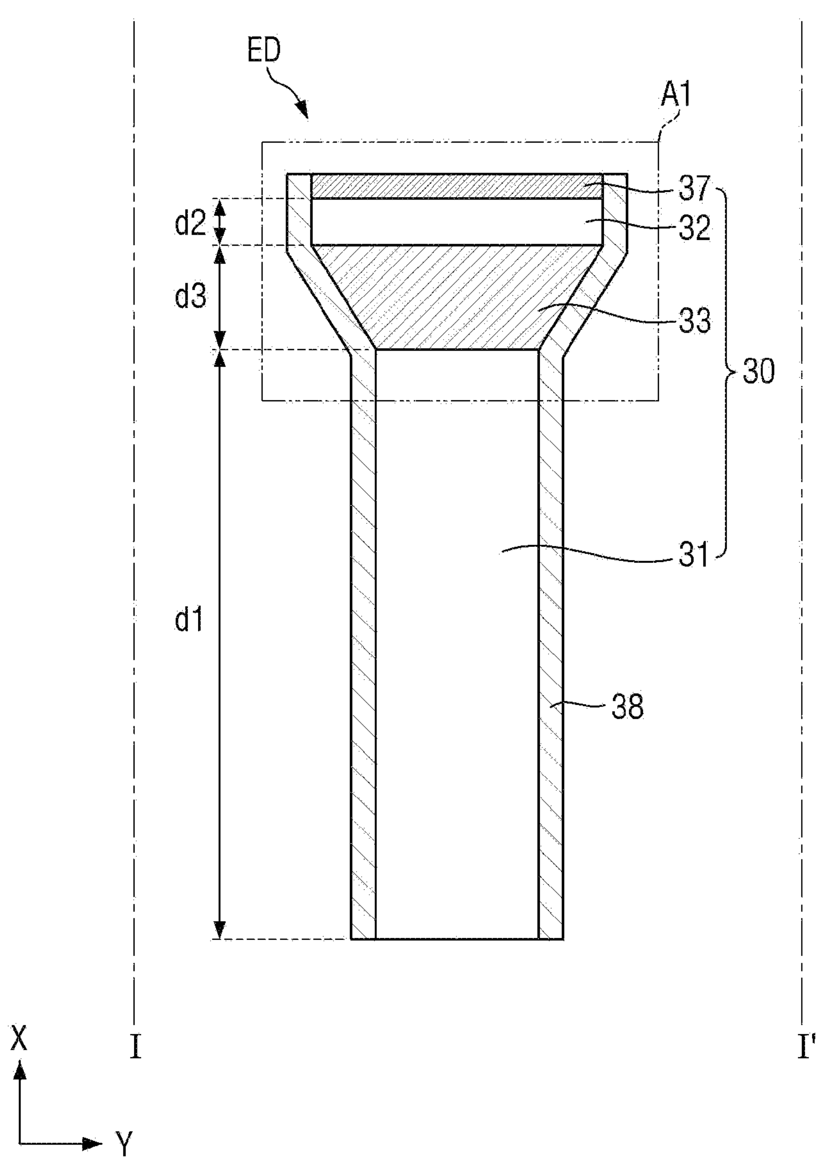
FIG. 2 is a cross-sectional view of the light emitting element of FIG. 1, which illustrates one example taken along the line I-I' of FIG. 1 according to one or more embodiments.

FIG. 1 is a schematic perspective cutaway view of a light emitting element according to one or more embodiments. FIG. 2 is a cross-sectional view of the light emitting element of FIG. 1, which illustrates one example taken along the line I-I' of FIG. 1 according to one or more embodiments.

Referring to FIGS. 1 and 2, a light emitting element ED which is a particulate element may have a rod or cylindrical shape having a suitable aspect ratio (e.g., a predetermined aspect ratio). The light emitting element ED may have a shape extending in one direction X. The length of the light emitting element ED in its extension direction (or longitudinal direction) X may be greater than the diameter of the light emitting element ED, and the aspect ratio may be 6:5 to 100:1, but they are not limited thereto. For example, the light emitting element ED may have a shape such as a cylinder, a rod, a wire, or a tube, a shape of polygonal prism such as a cube, a cuboid, or a hexagonal prism, or a shape extending in one direction and having an outer surface partially inclined. Hereinafter, in the drawings illustrating the shape of the light emitting element ED, the terms of one direction X, the extension direction X of the light emitting element ED, and the longitudinal direction X of the light emitting element ED may be used interchangeably.

The light emitting element ED may have a size of a nanometer scale (equal to or greater than 1 nm and less than 1 μm) to a micrometer scale (equal to or greater than 1 μm and less than 1 mm). In one or more embodiments, both the diameter and the length of the light emitting element ED may be on a nanometer scale, or on a micrometer scale. In one or more embodiments, the diameter of the light emitting element ED may be on a nanometer scale, while the length of the light emitting element ED may be on a micrometer scale. In one or more embodiments, some of the light emitting elements ED may have a diameter and/or length in a nanometer scale, while some others of the light emitting elements ED may have a diameter and/or length in a micrometer scale.

In one or more embodiments, the light emitting element ED may be an inorganic light emitting diode. The inorganic light emitting diode may include a plurality of semiconductor layers. For example, the inorganic light emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity type semiconductor layer and the second conductivity type semiconductor layer, respectively, and the holes and electrons that have reached the active semiconductor layer may be coupled to emit light. Further, the inorganic light emitting diode may be aligned between two electrodes having polarity when an electric field is formed in a specific direction between two electrodes opposing each other.

The light emitting element ED may include a light emitting element core 30 and an element insulating film 38.

The light emitting element core 30 may have a shape extending in the one direction X. The light emitting element core 30 may have a rod or cylindrical shape. However, the present disclosure is not limited thereto, and the light emitting element core 30 may have a shape of a polygonal prism such as a cube, a cuboid, or a hexagonal prism, or may have a shape extending in the one direction X with an outer surface partially inclined.

In one or more embodiments, the light emitting element core 30 may have a substantially symmetrical shape with respect to a cross section traversing the central portion of the light emitting element core 30 in the one direction X. Accordingly, the plurality of semiconductor layers included in the light emitting element core 30 to be described later may have a substantially symmetrical shape with respect to a cross section traversing the central portion of each semiconductor layer in the one direction X.

The light emitting element core 30 may include a first semiconductor layer 31, a second semiconductor layer 32, an element active layer 33, and an element electrode layer 37. The first semiconductor layer 31, the element active layer 33, the second semiconductor layer 32, and the element electrode layer 37 may be sequentially stacked along the one direction X, which is the longitudinal direction of the light emitting element core 30.

Hereinafter, unless otherwise stated in embodiments describing the light emitting element ED, "upper portion" indicates one side in the one direction X, i.e., a side on which the second semiconductor layer 32 is disposed with respect to the element active layer 33, and "top surface" indicates a surface toward one side in the one direction X. In addition, "lower portion" indicates the other side that is opposite to the one direction X, i.e., a side on which the first semiconductor layer 31 is disposed with respect to the element active layer 33, and "bottom surface" indicates a surface toward the other side in the one direction X.

The first semiconductor layer 31 may be doped with a first conductivity type dopant. The first conductivity type may be an n type, and the first conductivity type dopant may be Si, Ge, Sn, or the like. That is, the first semiconductor layer 31 may be an n-type semiconductor. In one or more embodiments, the first semiconductor layer 31 may be n-GaN doped with n-type Si.

The first semiconductor layer 31 may have a shape extending in the one direction X. In one or more embodiments, the first semiconductor layer 31 may have a columnar shape or a rod shape. The first semiconductor layer 31 may occupy most of the area of the light emitting element core 30 in the one direction X. Although not limited to the following, a thickness d1 (or length) of the first semiconductor layer 31 in the one direction X may be greater than half the length of the light emitting element core 30.

The second semiconductor layer 32 may be spaced from the first semiconductor layer 31 with the element active layer 33 interposed therebetween.

The second semiconductor layer 32 may be spaced from the first semiconductor layer 31 in the one direction X.

The second semiconductor layer 32 may be doped with a second conductivity type dopant. The second conductivity type may be a p type, and the second conductivity type dopant may be Mg, Zn, Ca, Sr, Ba, or the like. That is, the second semiconductor layer 32 may be a p-type semiconductor. In one or more embodiments, the second semiconductor layer 32 may be p-GaN doped with p-type Mg.

A thickness d2 (or length) of the second semiconductor layer 32 in the one direction X may be less than the thickness d1 of the first semiconductor layer 31. In one or more embodiments, the thickness d1 of the first semiconductor layer 31 may be greater than twice the thickness d2 of the second semiconductor layer 32. As the first semiconductor layer 31 is formed to have the thickness d1 greater than twice the thickness d2 of the second semiconductor layer 32, the first semiconductor layer 31 may occupy most of the area of the light emitting element core 30.

Although it is illustrated in the drawing that the first semiconductor layer 31 and the second semiconductor layer 32 are configured as one layer, the present disclosure is not limited thereto. Depending on the material of the element active layer 33, the first semiconductor layer 31 and the second semiconductor layer 32 may further include a larger number of layers, such as a cladding layer or a tensile strain barrier reducing (TSBR) layer.

The element active layer 33 may be disposed between the first semiconductor layer 31 and the second semiconductor layer 32. The element active layer 33 may include a material having a single or multiple quantum well structure.

The element active layer 33 may emit light by coupling of electron-hole pairs according to an electrical signal applied through the first semiconductor layer 31 and the second semiconductor layer 32. For example, when the element active layer 33 emits light of a blue wavelength band, a material such as AlGaN or AlGaInN may be included.

In one or more embodiments, the element active layer 33 may have a structure in which semiconductor materials having large band gap energy and semiconductor materials having small band gap energy are alternately stacked, and may include other Group III to V semiconductor materials according to the wavelength band of the emitted light. The light emitted by the element active layer 33 is not limited to light of a blue wavelength band, but the active layer 33 may also emit light of a red or green wavelength band in some cases.

A thickness d3 (or length) of the element active layer 33 in the one direction X may be less than the thickness d1 of the first semiconductor layer 31. The thickness d1 of the first semiconductor layer 31 may be greater than the sum of the thickness d3 of the element active layer 33 and the thickness d2 of the second semiconductor layer 32.

Light emitted from the element active layer 33 may be emitted not only from both end surfaces of the light emitting element ED in the one direction X, which is its longitudinal direction, but also from the side surface of the light emitting element ED.

The directionality of light emitted from the element active layer 33 is not limited to one direction.

The element electrode layer 37 may be disposed on the second semiconductor layer 32. The element electrode layer 37 may be disposed to be spaced from the element active layer 33 with the second semiconductor layer 32 interposed therebetween.

When both ends of the light emitting element ED are electrically connected to electrodes in order to apply an electrical signal to the first semiconductor layer 31 and the second semiconductor layer 32, the element electrode layer 37 may be disposed between the second semiconductor layer 32 and the electrode to reduce resistance. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The element insulating film 38 may be disposed to be around (or surround) the light emitting element core 30. For example, the element insulating film 38 may be disposed to be around (or surround) the side surface (or outer peripheral or circumferential surface) of the light emitting element core 30. The element insulating film 38 may be disposed to be around (or surround) the side surface of the element electrode layer 37 or the side surfaces of the plurality of semiconductor layers 31 and 32 included in the light emitting element core 30. The element insulating film 38 may serve to protect the plurality of semiconductor layers (e.g., first and second semiconductor layers 31 and 32) included in the light emitting element core 30.

The element insulating film 38 may be disposed to be around (or surround) at least the side surfaces of the first semiconductor layer 31, the element active layer 33, and the second semiconductor layer 32, and may extend in the one direction X in which the light emitting element core 30 extends. In the drawing, it is illustrated that the element insulating film 38 is formed to extend in the one direction X on the side surface of the light emitting element core 30 so as to completely cover from the side surface of the first semiconductor layer 31 to the side surface of the element electrode layer 37. However, the present disclosure is not limited thereto. In one or more embodiments, the element insulating film 38 may be disposed to extend from the side surface of the first semiconductor layer 31 to the side surface of the element electrode layer 37 in the one direction X, while exposing a part of the side surface of the element electrode layer 37.

The element insulating film 38 may be disposed to be around (or surround) the side surface of the light emitting element core 30 while exposing both end surfaces of the light emitting element core 30. Because the element insulating film 38 is not disposed on both end surfaces of the light emitting element core 30 (e.g., top and bottom surfaces of the light emitting element core 30 in FIG. 1), the element electrode layer 37 and the first semiconductor layer 31 of the light emitting element core 30 may be exposed by the element insulating film 38.

The element insulating film 38 may include a material having an insulating property. For example, the element insulating film 38 may include silicon oxide ($SiO_x$), silicon nitride ($SiN_x$), silicon oxynitride ($SiO_xN_y$), aluminum nitride (AlN), aluminum oxide ($Al_xO_y$), titanium oxide ($TiO_x$), zirconium oxide ($ZrO_x$), hafnium oxide ($HfO_x$), and the like.

Figure 22:
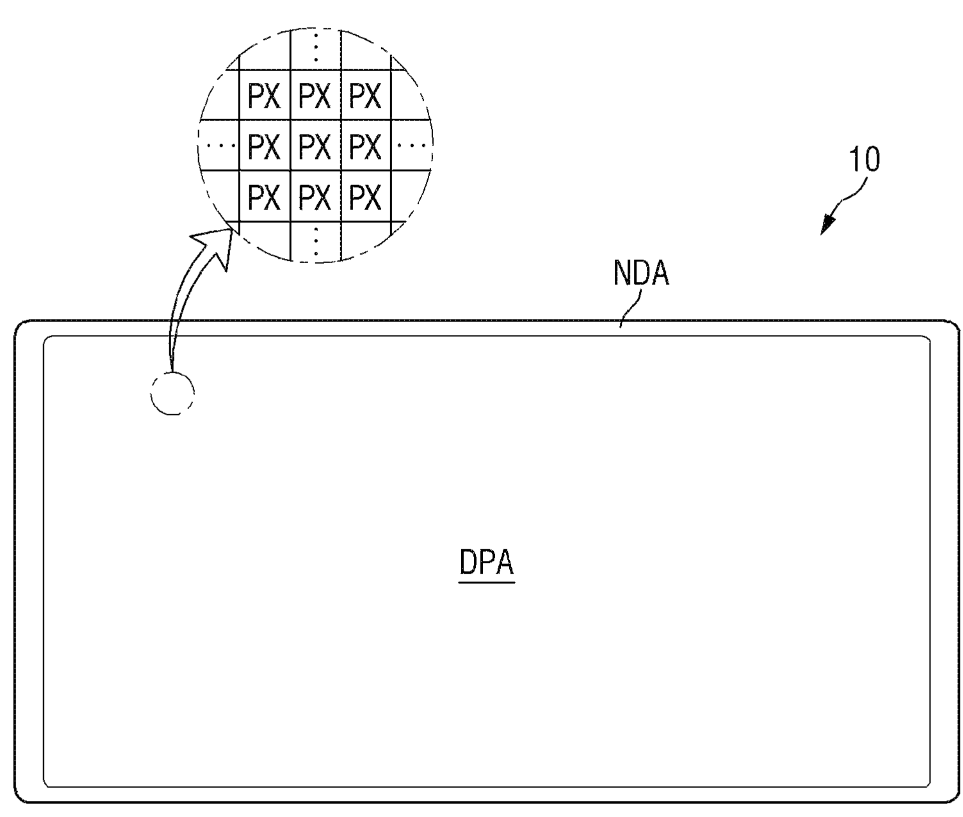
FIG. 22 is a plan view of a display device according to one or more embodiments.
Figure 22:
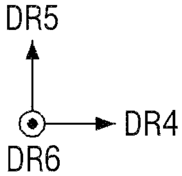

Because the element insulating film 38 is formed to completely cover from the side surface of the first semiconductor layer 31 to the side surface of the element active layer 33, the light emitting element core 30 may be prevented from being damaged in an etching process for forming a plurality of insulating layers during the manufacturing process of the display device 10 (see FIG. 22). Accordingly, as the element insulating film 38 prevents damage to the light emitting element core 30, a decrease in luminous efficiency of the display device 10 that may be caused by the damage to the light emitting element core 30 may be prevented. In addition, the element insulating film 38 may prevent an electrical short circuit that may occur when a contact electrode that is in contact with the light emitting element ED to transmit an electrical signal to the light emitting element ED comes into contact with the element active layer 33.

The length of the light emitting element ED may be included in the range of 1 μm to 10 μm or 2 μm to 6 μm, and in one or more embodiments in the range of 3 μm to 5 μm. In addition, the diameter of the light emitting element ED may be different along the one direction X, and may have a diameter in the range of 30 nm to 850 nm, and in one or more embodiments a diameter of 800 nm, but is not limited thereto.

Figure 3:
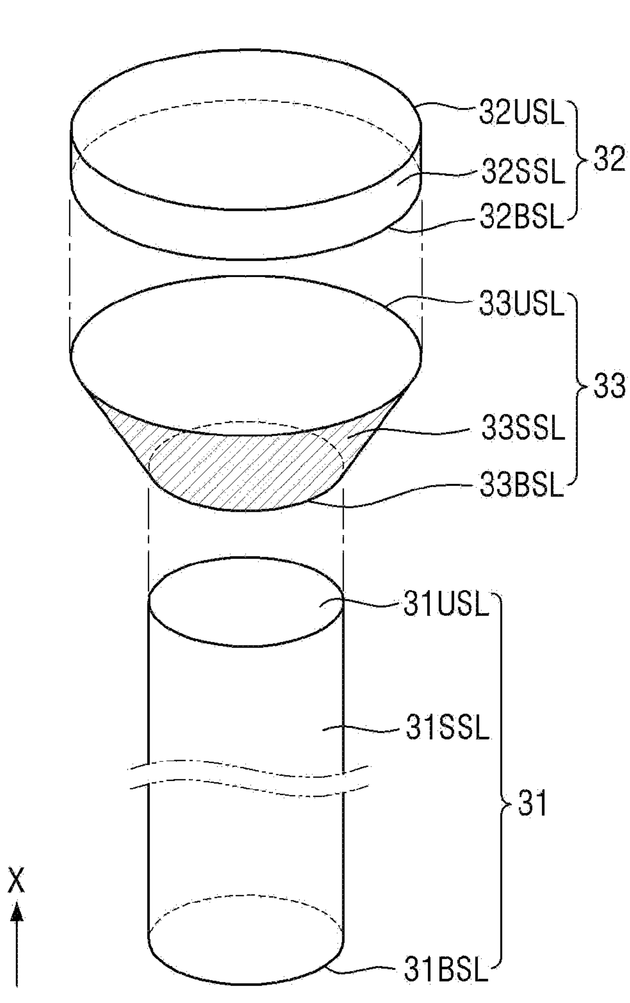
FIG. 3 is a schematic exploded perspective view illustrating an example of the first semiconductor layer, the second semiconductor layer, and the element active layer included in the light emitting element of FIG. 1 according to one or more embodiments.

FIG. 3 is a schematic exploded perspective view illustrating an example of the first semiconductor layer, the second semiconductor layer, and the element active layer included in the light emitting element of FIG. 1 according to one or more embodiments.

Referring to FIGS. 1 to 3, the first semiconductor layer 31 may include a first surface 31USL, a second surface 31BSL, and a third surface 31SSL. The first surface 31USL of the first semiconductor layer 31 may be disposed close to the element active layer 33, and the second surface 31BSL of the first semiconductor layer 31 may be opposite to the first surface 31USL of the first semiconductor layer 31.

The third surface 31SSL of the first semiconductor layer 31 may be disposed between the first surface 31USL of the first semiconductor layer 31 and the second surface 31BSL of the first semiconductor layer 31. The third surface 31SSL of the first semiconductor layer 31 may be the side surface (e.g., an outer surface or an outer circumferential surface) of the first semiconductor layer 31 connecting the first surface 31USL of the first semiconductor layer 31 to the second surface 31BSL of the first semiconductor layer 31, or may be the outer surface of the first semiconductor layer 31 extending in the one direction X. In the drawing, the first surface 31USL of the first semiconductor layer 31 may also be referred to as a top surface 31USL, the second surface 31BSL of the first semiconductor layer 31 may also be referred to as a bottom surface 31BSL, and the third surface 31SSL of the first semiconductor layer 31 may also be referred to as a side surface 31SSL.

In one or more embodiments, the diameter of the top surface 31USL of the first semiconductor layer 31 may be the same as the diameter of the bottom surface 31BSL of the first semiconductor layer 31. The first semiconductor layer 31 may have an overall uniform diameter along the one direction X. The side surface 31SSL of the first semiconductor layer 31 extending in the one direction X may be flat in cross-sectional view. However, the present disclosure is not limited thereto, and the first semiconductor layer 31 may have a diameter that varies along the one direction X. The first semiconductor layer 31 may have a diameter less than or equal to the minimum diameter of the second semiconductor layer 32 and the element active layer 33.

The second semiconductor layer 32 may include a first surface 32USL, a second surface 32BSL, and a third surface 32SSL. The first surface 32USL of the second semiconductor layer 32 may be disposed close to the element electrode layer 37, and the second surface 32BSL of the second semiconductor layer 32 may be disposed close to the element active layer 33. In addition, the second surface 32BSL of the second semiconductor layer 32 may be opposite to the first surface 32USL of the second semiconductor layer 32.

The third surface 32SSL of the second semiconductor layer 32 may be disposed between the first surface 32USL of the second semiconductor layer 32 and the second surface 32BSL of the second semiconductor layer 32. The third surface 32SSL of the second semiconductor layer 32 may be the side surface or outer surface (e.g., an outer circumferential surface) of the second semiconductor layer 32 connecting the first surface 32USL of the second semiconductor layer 32 to the second surface 32BSL of the second semiconductor layer 32. In the drawing, the first surface 32USL of the second semiconductor layer 32 may also be referred to as a top surface 32USL, the second surface 32BSL of the second semiconductor layer 32 may also be referred to as a bottom surface 32BSL, and the third surface 32SSL of the second semiconductor layer 32 may also be referred to as a side surface 32SSL (e.g., the outer circumferential surface).

In one or more embodiments, the diameter of the top surface 32USL of the second semiconductor layer 32 may be the same as the diameter of the bottom surface 32BSL of the second semiconductor layer 32. The second semiconductor layer 32 may have an overall uniform diameter along the one direction X. The side surface 32SSL of the second semiconductor layer 32 may be flat in cross-sectional view. However, the present disclosure is not limited thereto, and the second semiconductor layer 32 may have a diameter that varies along the one direction X. For example, in one or more embodiments, the diameter of the second semiconductor layer 32 may increase or decrease along the one direction X.

The element active layer 33 may include a first surface 33USL, a second surface 33BSL, and a third surface 33SSL. The first surface 33USL of the element active layer 33 may face the second semiconductor layer 32, and the second surface 33BSL of the element active layer 33 may face the first semiconductor layer 31. The first surface 33USL of the element active layer 33 and the second surface 33BSL of the element active layer 33 may be opposite to each other.

The third surface 33SSL of the element active layer 33 may be disposed between the first surface 33USL of the element active layer 33 and the second surface 33BSL of the element active layer 33. The third surface 33SSL of the element active layer 33 may be the side surface or outer surface (e.g., an outer circumferential surface) of the element active layer 33 connecting the first surface 33USL of the element active layer 33 to the second surface 33BSL of the element active layer 33. In the drawing, the first surface 33USL of the element active layer 33 may also be referred to as a top surface 33USL, the second surface 33BSL of the element active layer 33 may also be referred to as a bottom surface 33BSL, and the third surface 33SSL of the element active layer 33 may also be referred to as a side surface 33SSL.

In one or more embodiments, the side surface 33SSL of the element active layer 33 may be inclined with respect to the top surface 33USL of the element active layer 33 and/or the bottom surface 33BSL of the element active layer 33. For example, the diameter of the top surface 33USL of the element active layer 33 may be different from the diameter of the bottom surface 33BSL of the element active layer 33.

In the element active layer 33, the diameter of the top surface 33USL of the element active layer 33 may be greater than the diameter of the bottom surface 33BSL of the element active layer 33, and the side surface 33SSL of the element active layer 33 may have a shape inclined (tilted) with respect to the bottom surface 33BSL and/or the top surface 33USL of the element active layer 33. The diameter of the element active layer 33 may increase from the first semiconductor layer 31 to the second semiconductor layer 32. That is, the element active layer 33 has a tapered angle, and may have a truncated cone shape in which the diameter of the top surface 33USL of the element active layer 33 is greater than the diameter of the bottom surface 33BSL of the element active layer 33.

The first semiconductor layer 31, the element active layer 33, and the second semiconductor layer 32 may have a structure sequentially stacked along the one direction X. Boundary surfaces between the first semiconductor layer 31, the element active layer 33, and the second semiconductor layer 32 may be positioned on or at the same plane, and the diameters of the boundary surfaces in contact with each other may be substantially the same.

For example, the bottom surface 33BSL of the element active layer 33 may be positioned on the same plane as the top surface 31USL of the first semiconductor layer 31. The bottom surface 33BSL of the element active layer 33 may be in contact with the top surface 31USL of the first semiconductor layer 31. Although not limited to the following, the diameter of the bottom surface 33BSL of the element active layer 33 may be the same as the diameter of the top surface 31USL of the first semiconductor layer 31. However, the present disclosure is not limited thereto, and other semiconductor layers may be further provided between the element active layer 33 and the first semiconductor layer 31.

The top surface 33USL of the element active layer 33 may be positioned on or at the same plane as the bottom surface 32BSL of the second semiconductor layer 32. The top surface 33USL of the element active layer 33 may be in contact with the bottom surface 32BSL of the second semiconductor layer 32. Although not limited to the following, the diameter of the top surface 33USL of the element active layer 33 may be the same as the diameter of the bottom surface 32BSL of the second semiconductor layer 32. However, the present disclosure is not limited thereto, and other semiconductor layers may be further provided between the element active layer 33 and the second semiconductor layer 32.

Figure 4:
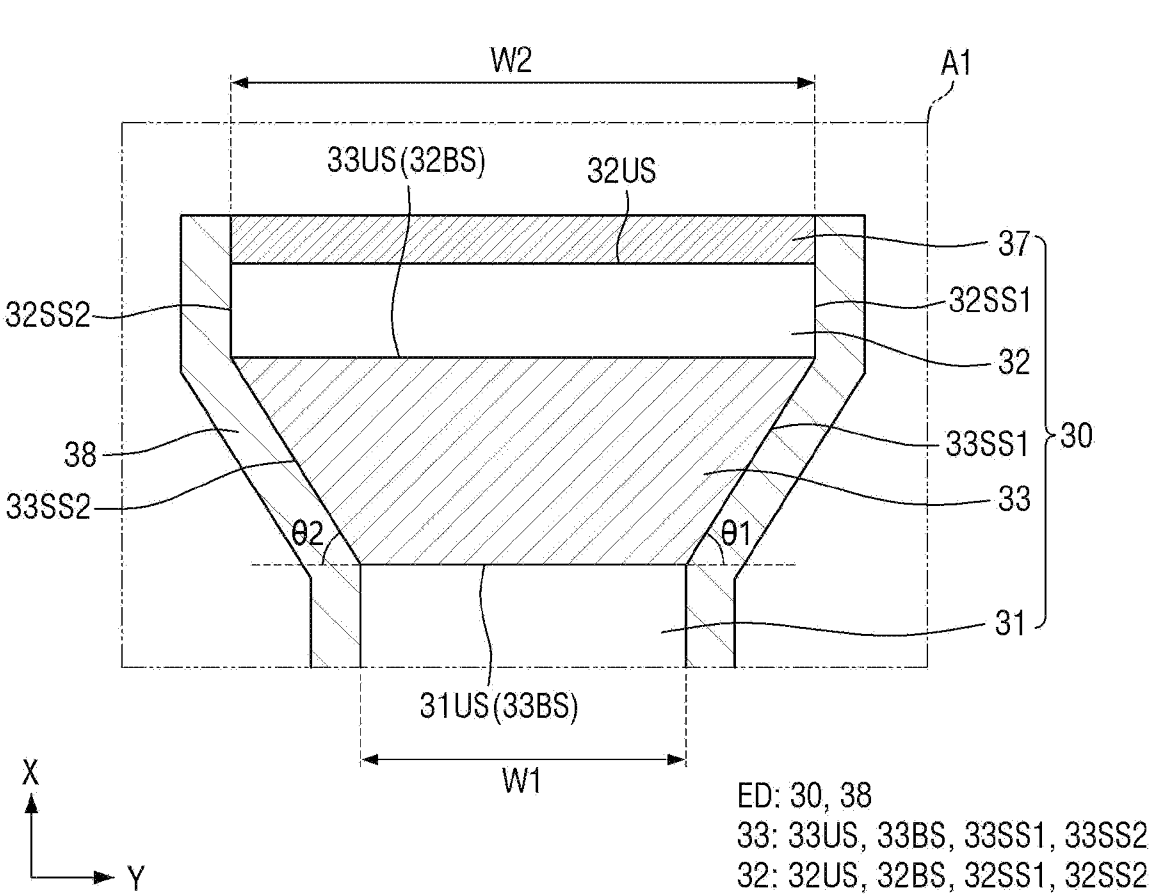
FIG. 4 is an enlarged cross-sectional view illustrating an example of an area A1 of FIG. 2 according to one or more embodiments.

FIG. 4 is an enlarged cross-sectional view illustrating an example of an area A1 of FIG. 2 according to one or more embodiments.

FIGS. 2 and 4 are cross-sectional views of the light emitting element ED taken along the one direction X, which is the extension direction of the light emitting element ED. Referring to FIGS. 2 to 4, the cross section of the element active layer 33 taken along the one direction X, which is the extension direction of the light emitting element ED, may include a first side 33US, a second side 33BS, a first lateral side 33SS1 and a second lateral side 33SS2.

The first side 33US of the element active layer 33 may be positioned at or on the top surface 33USL of the element active layer 33. The first side 33US of the element active layer 33 may also be referred to as an upper side 33US. The first side 33US of the element active layer 33 may extend in the other direction Y intersecting the one direction X.

The second side 33BS of the element active layer 33 may be positioned at or on the bottom surface 33BSL of the element active layer 33. The second side 33BS of the element active layer 33 may also be referred to as a lower side 33BS. The second side 33BS of the element active layer 33 may extend in the other direction Y, and may be opposite to the first side 33US of the element active layer 33.

The first lateral side 33SS1 of the element active layer 33 may be a side connecting one end of the first side 33US of the element active layer 33 to one end of the second side 33BS of the element active layer 33. The first lateral side 33SS1 of the element active layer 33 may be a right side 33SS1 of the element active layer 33.

The first lateral side 33SS1 of the element active layer 33 may be inclined with respect to the first side 33US of the element active layer 33 and/or the second side 33BS of the element active layer 33.

The second lateral side 33SS2 of the element active layer 33 may be a side connecting the other end of the first side 33US of the element active layer 33 to the other end of the second side 33BS of the element active layer 33. The second lateral side 33SS2 of the element active layer 33 may be a left side 33SS2 of the element active layer 33. The second lateral side 33SS2 of the element active layer 33 may be inclined with respect to the first side 33US of the element active layer 33 and/or the second side 33BS of the element active layer 33.

As described above, a diameter W2 of the top surface 33USL of the element active layer 33 may be greater than a diameter W1 of the bottom surface 33BSL of the element active layer 33. Accordingly, a length W2 of the first side 33US of the element active layer 33 may be different from a length W1 of the second side 33BS of the element active layer 33. The length W2 of the first side 33US of the element active layer 33 may be greater than the length W1 of the second side 33BS of the element active layer 33. Substantially, the length W2 of the first side 33US of the element active layer 33 may mean the diameter W2 of the top surface 33USL of the element active layer 33, and the length W1 of the second side 33BS of the element active layer 33 may mean the diameter W1 of the bottom surface 33BSL of the element active layer 33.

The first side 33US of the element active layer 33 may overlap the second side 33BS of the element active layer 33 in the one direction X. The first side 33US of the element active layer 33 may completely cover the second side 33BS of the element active layer 33, above the second side 33BS of the element active layer 33.

The first lateral side 33SS1 of the element active layer 33 and the second lateral side 33SS2 of the element active layer 33 may be inclined with respect to the second side 33BS of the element active layer 33. With respect to the second side 33BS of the element active layer 33, a direction in which the first lateral side 33SS1 of the element active layer 33 is inclined and a direction in which the second lateral side 33SS2 of the element active layer 33 is inclined may be opposite to each other.

Because the element active layer 33 is formed such that the first side 33US of the element active layer 33 overlaps the second side 33BS of the element active layer 33 in the one direction X and the length W2 of the first side 33US of the element active layer 33 is greater than that of the second side 33BS of the element active layer 33, the first lateral side 33SS1 of the element active layer 33 and the second lateral side 33SS2 of the element active layer 33 may be inclined at an obtuse angle with respect to the second side 33BS of the element active layer 33. Alternatively, the first lateral side 33SS1 of the element active layer 33 and the second lateral side 33SS2 of the element active layer 33 may be inclined at an acute angle with respect to the first side 33US of the element active layer 33. That is, the cross section of the element active layer 33 taken in the one direction X may have an inverted trapezoidal planar shape with an upper side longer than a lower side.

For example, because the first lateral side 33SS1 of the element active layer 33 is inclined at an obtuse angle with respect to the second side 33BS of the element active layer 33, an interior angle between the first lateral side 33SS1 of the element active layer 33 and the second side 33BS of the element active layer 33 may be an obtuse angle, and an exterior angle θ1 (hereinafter, referred to as a "first exterior angle") formed by the first lateral side 33SS1 of the element active layer 33 and the second side 33BS of the element active layer 33 may be an acute angle. Similarly, an interior angle between the second lateral side 33SS2 of the element active layer 33 and the second side 33BS of the element active layer 33 may be an obtuse angle, and an exterior angle θ2 (hereinafter, referred to as a "second exterior angle") formed by the second lateral side 33SS2 of the element active layer 33 and the second side 33BS of the element active layer 33 may be an acute angle. Hereinafter, for simplicity of description in the present disclosure, an acute angle between an extension line of the second side 33BS of the element active layer 33 and one lateral side of the element active layer 33 may mean an exterior angle formed by the second side 33BS of the element active layer 33 and one lateral side of the element active layer 33.

The first lateral side 33SS1 of the element active layer 33 may be inclined with the first exterior angle θ1 with respect to the second side 33BS of the element active layer 33. The size of the first exterior angle θ1 formed by the second side 33BS of the element active layer 33 and the first lateral side 33SS1 of the element active layer 33 may be included in the range of 55° to 75° or 57° to 73°, and in one or more embodiments in the range of 60° to 73°.

The second lateral side 33SS2 of the element active layer 33 may be inclined with the second exterior angle θ2 with respect to the second side 33BS of the element active layer 33. The size of the second exterior angle θ2 formed by the second side 33BS of the element active layer 33 and the second lateral side 33SS2 of the element active layer 33 may be included in the range of 55° to 75° or 57° to 73°, and in one or more embodiments in the range of 60° to 73°.

In one or more embodiments, the size of the first exterior angle θ1 and the size of the second exterior angle θ2 may be the same. That is, the element active layer 33 may have a symmetrical shape with respect to a cross section traversing the central portion of the element active layer 33 in the one direction X. Alternatively, the cross section of the element active layer 33 may be symmetrical with respect to a reference line passing through the central portion of the element active layer 33 and extending in the one direction X. Accordingly, the first lateral side 33SS1 of the element active layer 33 and the second lateral side 33SS2 of the element active layer 33 may be in a symmetrical relationship to each other with respect to the reference line passing through the central portion of the element active layer 33 and extending in the one direction X. However, the present disclosure is not limited thereto, and the size of the first exterior angle θ1 and the size of the second exterior angle θ2 may be different from each other.

The diameter W1 of the bottom surface 33BSL of the element active layer 33 may be included in the range of 400 nm to 650 nm, and in one or more embodiments in the range of 400 nm to 600 nm, but is not limited thereto.

A cross section of the first semiconductor layer 31 taken along the one direction X, which is the extension direction of the light emitting element ED, may include a first side 31US. The first side 31US of the first semiconductor layer 31 may be positioned at the top surface 31USL of the first semiconductor layer 31. The first side 31US of the first semiconductor layer 31 may be substantially the same as the second side 33BS of the element active layer 33. As the bottom surface 33BSL of the element active layer 33 and the top surface 31USL of the first semiconductor layer 31 are formed to be in contact with each other, the diameter W1 of the top surface 31USL of the first semiconductor layer 31 and the diameter W1 of the bottom surface 33BSL of the element active layer 33 may be the same. Accordingly, the length W1 of the first side 31US of the first semiconductor layer 31 may be the same as the length W1 of the second side 33BS of the element active layer 33.

The diameter W1 of the top surface 31USL of the first semiconductor layer 31 may be substantially the same as the diameter W1 of the bottom surface 33BSL of the element active layer 33, and may have a diameter in the same range. For example, the diameter W1 of the top surface 31USL of the first semiconductor layer 31 may be included in the range of 400 nm to 650 nm, and in one or more embodiments in the range of 400 nm to 600 nm, but is not limited thereto.

The side surface 31SSL of the first semiconductor layer 31 may be substantially perpendicular to the top surface 31USL of the first semiconductor layer 31. Accordingly, the side surface 335SL of the element active layer 33 may be inclined with respect to the side surface 335SL of the first semiconductor layer 31.

A cross section of the second semiconductor layer 32 taken along the one direction X, which is the extension direction of the light emitting element ED, may include a first side 32US, a second side 32BS, a first lateral side 32SS1, and a second lateral side 32SS2.

The first side 32US of the second semiconductor layer 32 may be positioned at the top surface 32USL of the second semiconductor layer 32. The first side 32US of the second semiconductor layer 32 may also be referred to as an upper side 32US of the second semiconductor layer 32. The first side 32US of the second semiconductor layer 32 may extend in the other direction Y.

The second side 32BS of the second semiconductor layer 32 may be positioned at or on the bottom surface 32BSL of the second semiconductor layer 32. The second side 32BS of the second semiconductor layer 32 may also be referred to as a lower side 32BS of the second semiconductor layer 32. The second side 32BS of the second semiconductor layer 32 may be opposite to the first side 32US of the second semiconductor layer 32. The second side 32BS of the second semiconductor layer 32 may extend in the other direction Y.

The second side 32BS of the second semiconductor layer 32 may be substantially the same as the first side 33US of the element active layer 33. Because the top surface 33USL of the element active layer 33 and the bottom surface 32BSL of the second semiconductor layer 32 are formed to be in contact with each other, the diameter W2 of the bottom surface 32BSL of the second semiconductor layer 32 and the diameter W2 of the top surface 33USL of the element active layer 33 may be the same. Accordingly, the length W2 of the second side 32BS of the second semiconductor layer 32 may be the same as the length W2 of the first side 33US of the element active layer 33.

The first lateral side 32SS1 of the second semiconductor layer 32 may be a side connecting one end of the first side 32US of the second semiconductor layer 32 to one end of the second side 32BS of the second semiconductor layer 32. The first lateral side 32SS1 of the second semiconductor layer 32 may be a right side of the second semiconductor layer 32. The first lateral side 32SS1 of the second semiconductor layer 32 may be perpendicular to the first side 32US of the second semiconductor layer 32 and the second side 32BS of the second semiconductor layer 32.

The second lateral side 32SS2 of the second semiconductor layer 32 may be a side connecting the other end of the first side 32US of the second semiconductor layer 32 to the other end of the second side 32BS of the second semiconductor layer 32. The second lateral side 32SS2 of the second semiconductor layer 32 may be a left side of the second semiconductor layer 32. The second lateral side 32SS2 of the second semiconductor layer 32 may be perpendicular to the first side 32US of the second semiconductor layer 32 and the second side 32BS of the second semiconductor layer 32.

In the present embodiment, one end of the light emitting element core 30 may be the top surface of the element electrode layer 37, and the other end of the light emitting element core 30 may be the bottom surface 31BSL of the first semiconductor layer 31. In addition, the minimum diameter of the element electrode layer 37 or the second semiconductor layer 32 may be greater than the maximum diameter (or diameter) of the first semiconductor layer 31. Accordingly, in the cross-sectional shape of the light emitting element core 30, a diameter may be substantially uniform along the one direction X in a region where the first semiconductor layer 31 is disposed, may increase along the one direction X in a region where the element active layer 33 is disposed, and may be substantially uniform along the one direction X in a region where the second semiconductor layer 32 and the element electrode layer 37 are disposed.

Figure 5:
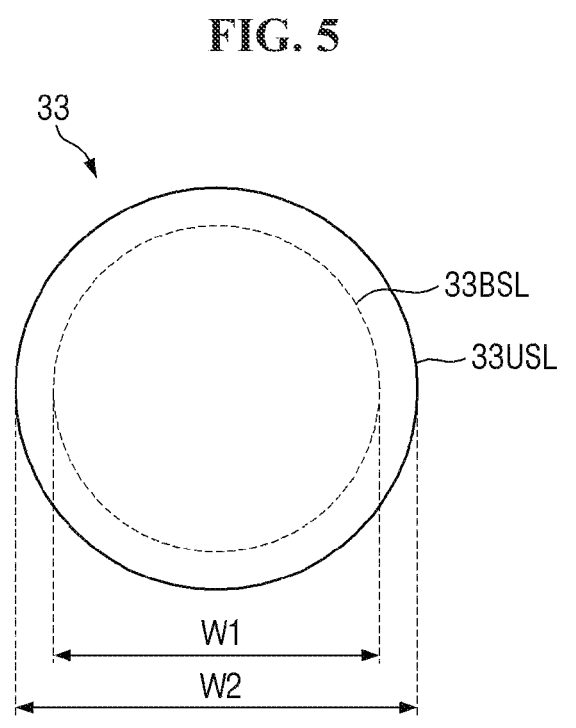

FIG. 5 is a plan view illustrating a relative planar arrangement between a first surface and a second surface of an element active layer included in the light emitting element of FIG. 1 according to one or more embodiments.

Referring to FIGS. 3 and 5, the top surface (first surface) 33USL of the element active layer 33 may completely cover the bottom surface (second surface) 33BSL of the element active layer 33 in the one direction X. Because the diameter W2 of the top surface 33USL of the element active layer 33 is greater than the diameter W1 of the bottom surface 33BSL of the element active layer 33, and the top surface 33USL of the element active layer 33 completely covers the bottom surface 33BSL of the element active layer 33 in a plan view, the bottom surface 33BSL of the element active layer 33 may be positioned inside the top surface 33USL of the element active layer 33. Accordingly, the side surface 33SSL of the element active layer 33 connecting the bottom surface 33BSL of the element active layer 33 to the top surface 33USL of the element active layer 33 may be inclined with respect to the bottom surface 33BSL of the element active layer 33 over the entire region of the element active layer 33.

Hereinafter, a manufacturing process of the light emitting element ED according to the embodiment of FIG. 1 will be described in order with reference to other drawings.

FIGS. 6 to 12 are cross-sectional views illustrating process steps in a method of manufacturing a light emitting element according to one or more embodiments.

Hereinafter, a first direction DR1, a second direction DR2, and a third direction DR3 are defined in drawings of an embodiment for describing the fabricating process of the light emitting element ED. The first direction DR1 and the second direction DR2 may be perpendicular to each other, and the third direction DR3 may be a direction perpendicular to a plane on which the first direction DR1 and the second direction DR2 are placed.

The third direction DR3 may be a direction parallel to the one direction X, which is the extension direction of the light emitting element ED formed on a lower substrate 1000. In the embodiment describing the fabricating process of the light emitting element ED, unless otherwise stated, "upward" indicates one side of the third direction DR3, i.e., a direction in which the plurality of semiconductor layers of the light emitting element ED are stacked from one surface (or top surface) of the lower substrate 1000, and "top surface" indicates a surface toward one side of the third direction DR3. Further, the term "downward" refers to the other side of the third direction DR3, and the term "bottom surface" refers to a surface toward the other side of the third direction DR3.

Figure 6:
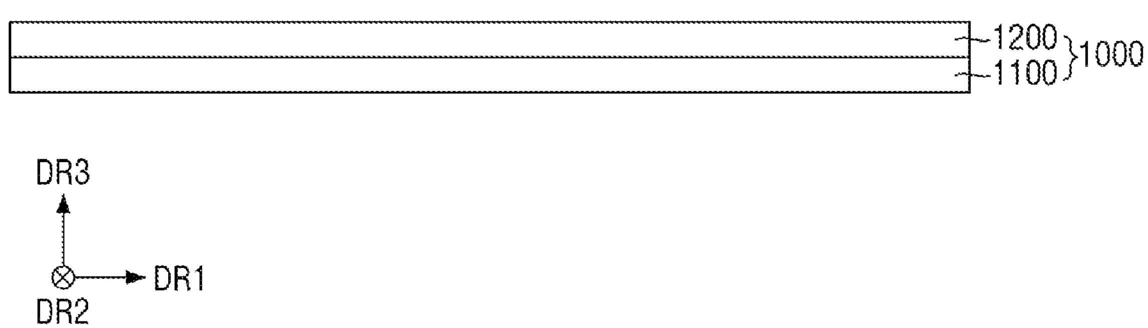
FIGS. 6 to 12 are cross-sectional views illustrating process steps in a method of manufacturing a light emitting element according to one or more embodiments.

First, referring to FIG. 6, the lower substrate 1000 is prepared.

For example, the lower substrate 1000 may include a base substrate 1100 and a buffer material layer 1200 disposed on the base substrate 1100.

The base substrate 1100 may include a sapphire substrate (AlxOy) or a transparent substrate such as glass. However, the present disclosure is not limited thereto, and the base substrate 1100 may include a conductive substrate such as GaN, SiC, ZnO, Si, GaP and GaAs. In one or more embodiments, the base substrate 1100 may be a sapphire substrate (AlxOy).

A plurality of semiconductor layers may be formed on the base substrate 1100. The plurality of semiconductor layers may be formed by growing a seed crystal on the base substrate 1100 by epitaxial growth. The semiconductor layer may be formed using electron beam deposition, physical vapor deposition (PVD), chemical vapor deposition (CVD), plasma laser deposition (PLD), dual-type thermal evaporation, sputtering, metal organic chemical vapor deposition (MOCVD), or the like.

The buffer material layer 1200 may be formed on one surface (or top surface) of the base substrate 1100. The buffer material layer 1200 may serve to reduce a lattice constant difference between the base substrate 1100 and a first semiconductor material layer 3100 (see FIG. 7) to be described later. The buffer material layer 1200 may include an undoped semiconductor. The buffer material layer 1200 may include the same material as the first semiconductor material layer 3100 to be described later, but may include a material not doped with the first conductivity type dopant or the second conductivity type dopant, e.g., an n-type or p-type dopant. Although the drawing shows that the buffer material layer 1200 is stacked as a single layer, the buffer material layer 1200 may be formed of a plurality of layers. The buffer material layer 1200 may be omitted depending on the type of the base substrate 1100.

Figure 7:
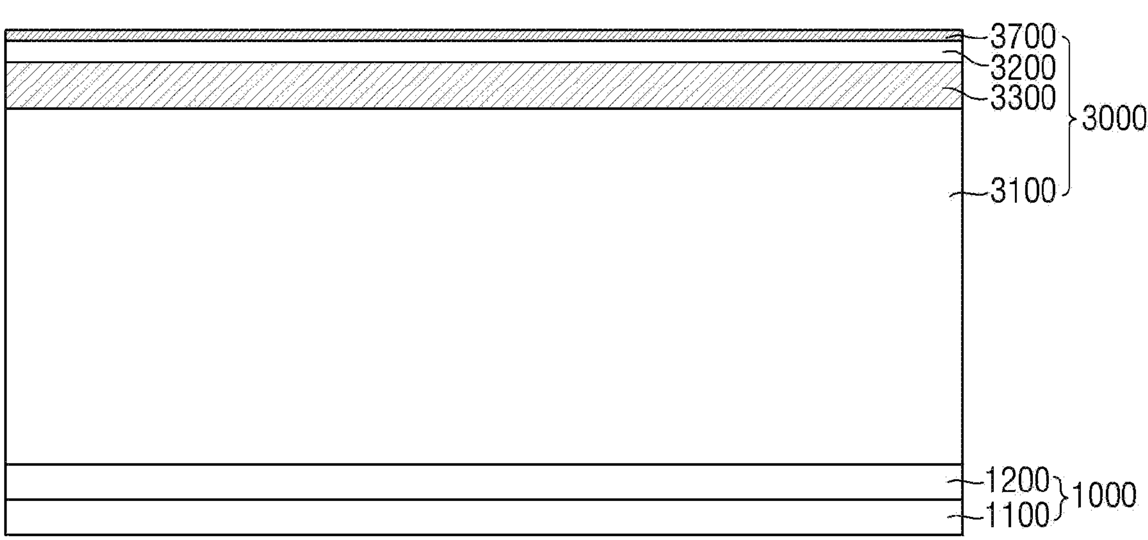
Figure 7:
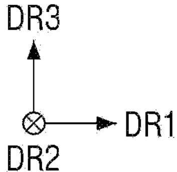

Next, as shown in FIG. 7, a first semiconductor structure 3000 is formed on the lower substrate 1000.

For example, a first semiconductor structure 3000 in which the first semiconductor material layer 3100, an active material layer 3300, a second semiconductor material layer 3200, and an electrode material layer 3700 are sequentially stacked is formed on the lower substrate 1000.

The plurality of layers included in the first semiconductor structure 3000 may correspond respectively to the layers included in the light emitting element core 30 according to one or more embodiments. For example, the first semiconductor material layer 3100, the active material layer 3300, the second semiconductor material layer 3200, and the electrode material layer 3700 of the first semiconductor structure 3000 may correspond to the first semiconductor layer 31, the element active layer 33, the second semiconductor layer 32, and the element electrode layer 37 of the light emitting element core 30, respectively, and may include the same material as a material included in each layer.

The thickness of the first semiconductor material layer 3100 may be greater than the thickness of the second semiconductor material layer 3200. The thickness of the first semiconductor material layer 3100 may be greater than twice the thickness of the second semiconductor material layer 3200. The thickness of the first semiconductor material layer 3100 may be greater than the thickness of the active material layer 3300. The thickness of the first semiconductor material layer 3100 may be greater than the sum of the thickness of the second semiconductor material layer 3200 and the thickness of the active material layer 3300.

Figure 8:
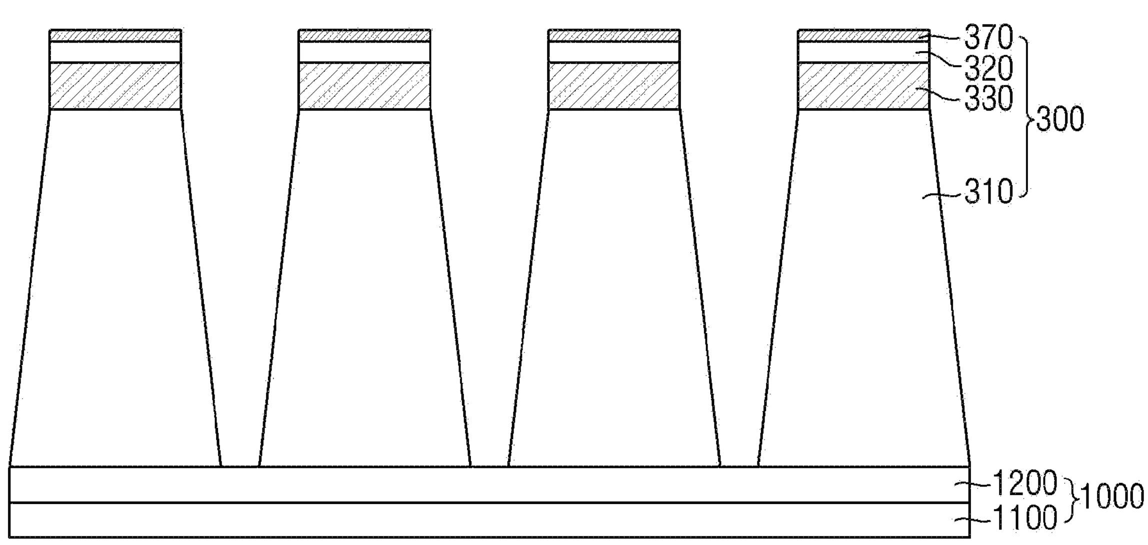
Figure 8:
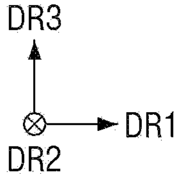

Next, referring to FIGS. 7 and 8, the first semiconductor structure 3000 is etched to form second semiconductor structures 300 spaced from each other.

For example, the first etching process of etching the first semiconductor structure 3000 of FIG. 7 in a direction, e.g., in the third direction DR3, perpendicular to the top surface of the lower substrate 1000 is performed to form, as shown in FIG. 8, the second semiconductor structures 300 spaced from each other.

The first semiconductor structure 3000 may be etched by a conventional patterning method. For example, the patterning method may be performed by forming an etch mask layer on the first semiconductor structure 3000 and etching the first semiconductor structure 3000 along the etch mask layer in the third direction DR3.

The first etching process of etching the first semiconductor structure 3000 may be performed by dry etching. The first semiconductor material layer 3100, the active material layer 3300, the second semiconductor material layer 3200, and the electrode material layer 3700 of the first semiconductor structure 3000 may be etched through the first etching process performed by dry etching to form a plurality of second semiconductor structures 300 spaced from each other shown in FIG. 8. In the case of dry etching, anisotropic etching may be possible, so it may be suitable for vertical etching.

A first semiconductor material layer 310 of the second semiconductor structure 300 may have a shape in which the width thereof decreases toward the upper portion thereof. For example, the first semiconductor material layer 310 of the second semiconductor structure 300 may have a trapezoidal shape in a cross-sectional view taken in the third direction DR3. The first semiconductor material layer 310 of the second semiconductor structure 300 may have a shape in which the side surface thereof is inclined.

On the other hand, it is illustrated in the drawing that the first semiconductor material layer 310 of the second semiconductor structure 300 has an inclined side surface, and the active material layer 330, the second semiconductor material layer 320, and the electrode material layer 370 of the second semiconductor structure 300 have a vertical side surface. However, the present disclosure is not limited thereto. For example, the side surfaces of the first semiconductor material layer 310, the active material layer 330, the second semiconductor material layer 320, and the electrode material layer 370 included in the second semiconductor structure 300 may be aligned in a line, but may have an inclined shape.

In the present etching process, semiconductor material defects may occur on the surfaces of the first semiconductor material layer 310, the second semiconductor material layer 320, and the active material layer 330 included in the second semiconductor structure 300. A semiconductor material positioned on the surfaces of the first semiconductor material layer 310, the second semiconductor material layer 320, and the active material layer 330 exposed to an etchant used in the present etching process may be damaged by the etchant to form the semiconductor material defects.

Figure 9:
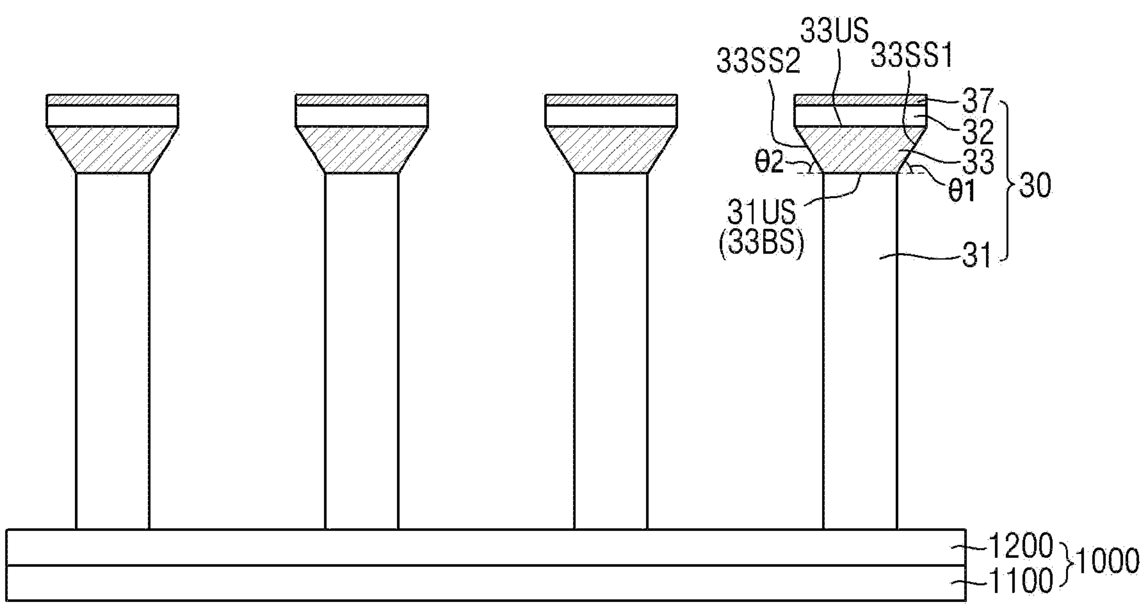
Figure 9:
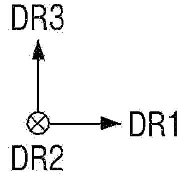

Next, referring to FIGS. 8 and 9, the second semiconductor structure 300 is etched to form the light emitting element core 30.

For example, a second etching process is performed on the second semiconductor structure 300 of FIG. 8 to form the light emitting element cores 30 spaced from each other as shown in FIG. 9.

The second etching process of etching the second semiconductor structure 300 may be performed by wet etching. A part of the side surfaces of the first semiconductor material layer 310, the active material layer 330, the second semiconductor material layer 320, and the electrode material layer 370 of the second semiconductor structure 300 may be etched in the second etching process performed by the wet etching to form the above-described light emitting element core 30 as shown in FIG. 9.

The light emitting element core 30 may include the first semiconductor layer 31, the second semiconductor layer 32, and the element electrode layer 37 which are perpendicular to the top surface of the lower substrate 1000, and the element active layer 33 inclined with respect to the top surface of the lower substrate 1000.

Through the second etching process, the first semiconductor material layer 310 of the second semiconductor structure 300 inclined with respect to the top surface of the lower substrate 1000 (e.g., as shown in FIG. 8) may be formed as the first semiconductor layer 31 of the light emitting element core 30 perpendicular to the top surface of the lower substrate 1000 (e.g., as shown in FIG. 9).

Through the second etching process, the active material layer 330 of the second semiconductor structure 300 perpendicular to the top surface of the lower substrate 1000 (e.g., as shown in FIG. 8), may be formed as the element active layer 33 in which the first and second lateral sides 33SS1 and 33SS2 of the element active layer 33 are inclined with respect to the lower side 33BS of the element active layer 33 or the upper side 31US of the first semiconductor layer 31 (e.g., as shown in FIG. 9).

That is, through the second etching process, the element active layer 33 having an increasing diameter from the first semiconductor layer 31 to the second semiconductor layer 32 may be formed.

As described above, the size of the first exterior angle θ1 formed by the lower side 33BS of the element active layer 33 and the first lateral side 33SS1 of the element active layer 33 may be included in the range of 55° to 75° or 57° to 73°, and in one or more embodiments in the range of 60° to 73°. Similarly, the size of the second exterior angle θ2 formed by the lower side 33BS of the element active layer 33 and the second lateral side 33SS2 of the element active layer 33 may be included in the range of 55° to 75° or 57° to 73°, and in one or more embodiments in the range of 60° to 73°. In addition, the diameter of the bottom surface of the element active layer 33 of the light emitting element core 30 formed through the present etching process may be included in the range of 400 nm to 650 nm, and in one or more embodiments in the range of 400 nm to 600 nm, but is not limited thereto.

A part of the surface damage formed on the surfaces of the plurality of semiconductor layers included in the second semiconductor structure 300 may be removed through the second etching process. In one or more embodiments in which the first etching process is performed by dry etching and the second etching process is performed by wet etching, a region (hereinafter, referred to as a "surface damage region") having damage to the semiconductor material formed on the surface of the second semiconductor structure 300 may be partially removed by the etchant (or etching etchant) used in the second etching process. Accordingly, the area of the surface damage region formed on the outer surface (e.g., the outer peripheral or circumferential surface) of the light emitting element core 30 may be reduced. On the other hand, when the process time of the second etching process is excessively increased in order to completely remove the surface defect region having the semiconductor material defect on the surface of the second semiconductor structure 300, the diameter of the light emitting element core 30 may be reduced, so that the area through which light from the light emitting element ED is emitted may decrease, and thus the luminous efficiency of the light emitting element ED may be reduced. In addition, if the surface defect region having the semiconductor material defect on the surface of the second semiconductor structure 300 is not removed, electrons may be leaked from the surface of the damaged semiconductor layer or holes may be captured by the surface damage, resulting in a factor impairing the luminous efficiency of the light emitting element ED.

In the present embodiment, the process conditions of the second etching process may be adjusted such that the side surface of the element active layer 33 is inclined with respect to the bottom surface thereof, and the size of the exterior angle formed by the side surface of the element active layer 33 and the bottom surface of the element active layer 33 is included in the range of 55° to 75°, or 57° to 73°, and in one or more embodiments in the range of 60° to 73°, thereby efficiently removing the surface defect region formed on the surface of the element active layer 33. Accordingly, the surface defect region having the semiconductor material defect on the surface of the element active layer 33 may be efficiently reduced, so that the luminous efficiency of the light emitting element ED may be improved.

Figure 10:
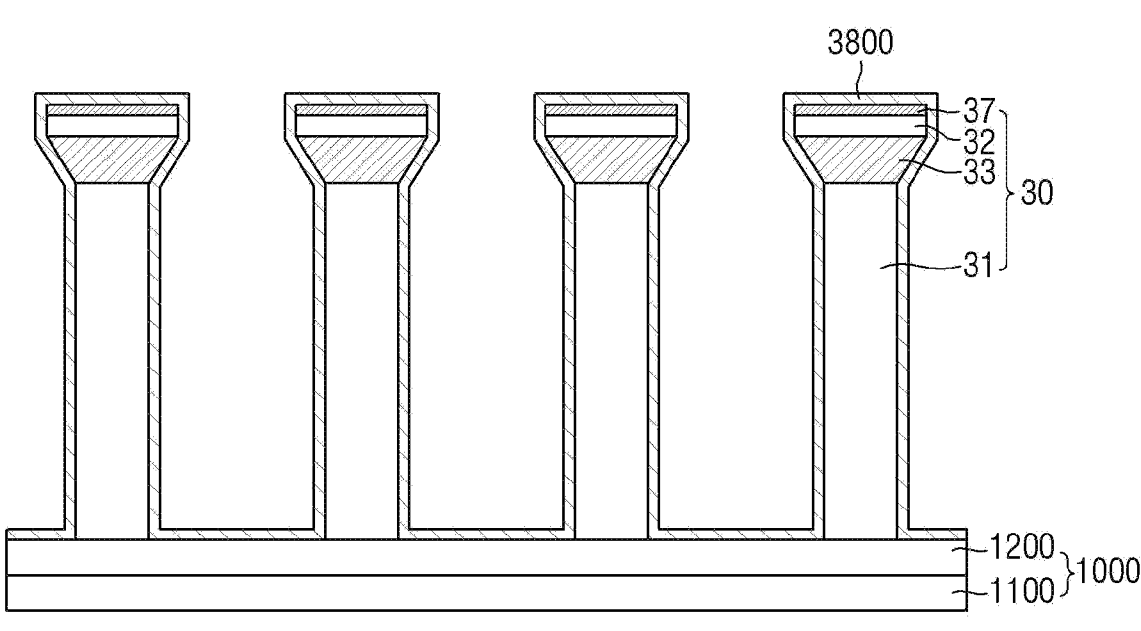
Figure 10:
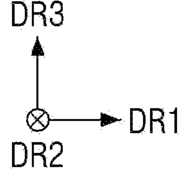

Next, referring to FIG. 10, an insulating material layer 3800 is formed on the plurality of light emitting element cores 30.

For example, the insulating material layer 3800 is formed on the outer surfaces of the plurality of light emitting element cores 30. The insulating material layer 3800 may be formed on the entire surface of the lower substrate 1000, and thus may be formed not only on the outer surface of the light emitting element core 30 but also on the top surface of the buffer material layer 1200 exposed by the light emitting element core 30. The outer surface of the light emitting element core 30 may include a side surface and a top surface of the light emitting element core 30. The insulating material layer 3800 may correspond to the element insulating film 38 of the light emitting element ED, and may include the same material as that of the element insulating film 38.

The insulating material layer 3800 may be formed using a method of coating or immersing an insulating material on or in the outer surface of the light emitting element core 30. For example, the insulating material layer 3800 may be formed by atomic layer deposition (ALD) or chemical vapor deposition (CVD).

Figure 11:
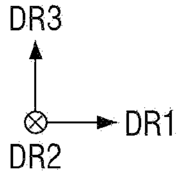

Next, referring to FIG. 11, the insulating material layer 3800 is partially removed to form the element insulating film 38 around (or surrounding) the side surface (e.g., outer surface or outer peripheral or circumferential surface) of the light emitting element core 30. The step of forming the element insulating film 38 may include an etching process of partially removing the insulating material layer 3800 such that one end surface of the light emitting element core 30, e.g., the top surface of the element electrode layer 37 is exposed. The step of partially removing the insulating material layer 3800 may be performed through a process such as etch-back or dry etching which is anisotropic etching.

Figure 12:
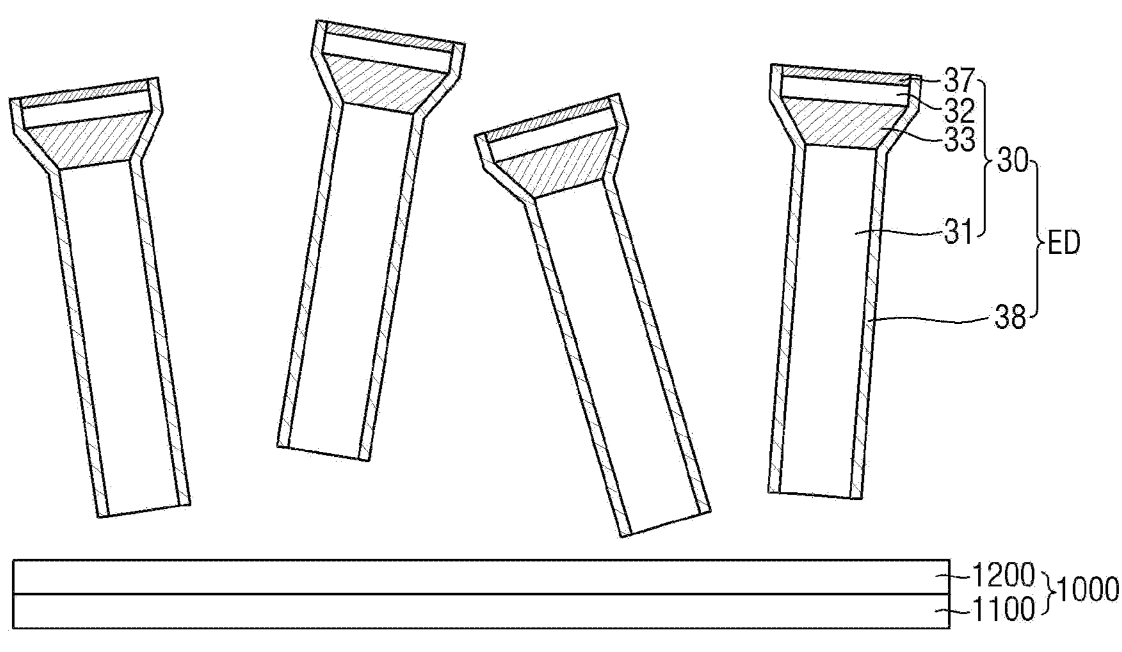
Figure 12:
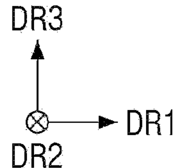

Next, referring to FIG. 12, the plurality of light emitting elements ED are separated from the lower substrate 1000. For example, the step of separating the plurality of light emitting elements ED from the lower substrate 1000 is not particularly limited. For example, the separation step of the plurality of light emitting elements ED may be performed by a physical separation method, a chemical separation method, or the like.

Hereinafter, among the light emitting elements ED according to the above-described embodiment, characteristic evaluation of the light emitting element ED depending on the size of the exterior angle formed by the side surface 33SSL of the element active layer 33 and the bottom surface 33BSL of the element active layer 33 will be described.

Light emitting element samples SAMPLE #1, SAMPLE #2, SAMPLE #3, and SAMPLE #4 depending on the size of the exterior angle formed by the side surface 33SSL of the element active layer 33 and the bottom surface 33BSL of the element active layer 33 were prepared as follows. In the light emitting element samples SAMPLE #1 to SAMPLE #4 prepared in this characteristic evaluation, the diameter of the element active layer 33, the exterior angle formed by the bottom surface and the side surface of the element active layer 33, and the efficiency of the light emitting element are shown in Table 1 below. Here, the efficiency (%) of the light emitting element may be external quantum efficiency (EQE). In this case, in the light emitting element samples SAMPLE #1 to SAMPLE #4, the diameter of the bottom surface 33BSL of the element active layer 33 may be different for each sample depending on the size of the exterior angle formed by the side surface 33SSL of the element active layer 33 and the bottom surface 33BSL of the element active layer 33.

TABLE 1

| Light Emitting Element Sample | Diameter of Bottom Surface of Element Active Layer | Size of Exterior Angle between Bottom Surface of Element Active Layer and Side Surface of Element Active Layer | Efficiency of Light Emitting Element (%) |
|---|---|---|---|
| SAMPLE#1 | 561 nm | 90° | 4.3 ± 0.4 |
| SAMPLE#2 | 481 nm | 73° | 5.0 ± 0.4 |
| SAMPLE#3 | 482 nm | 68° | 5.8 ± 0.9 |
| SAMPLE#4 | 419 nm | 57° | 6.1 ± 0.7 |

As shown in Table 1, it can be seen that when the exterior angle formed by the bottom surface of the element active layer and the side surface of the element active layer has a size of 73° or less, instead of having a size of 90°, the light emitting characteristic of the light emitting element ED is improved. As described above, it was confirmed that as the surface defect of the semiconductor layer generated in the first etching process performed by dry etching was removed through the second etching process, the luminous efficiency characteristic of the light emitting element ED was improved.

Hereinafter, a light emitting element ED according to one or more embodiments will be described.

Figure 13:
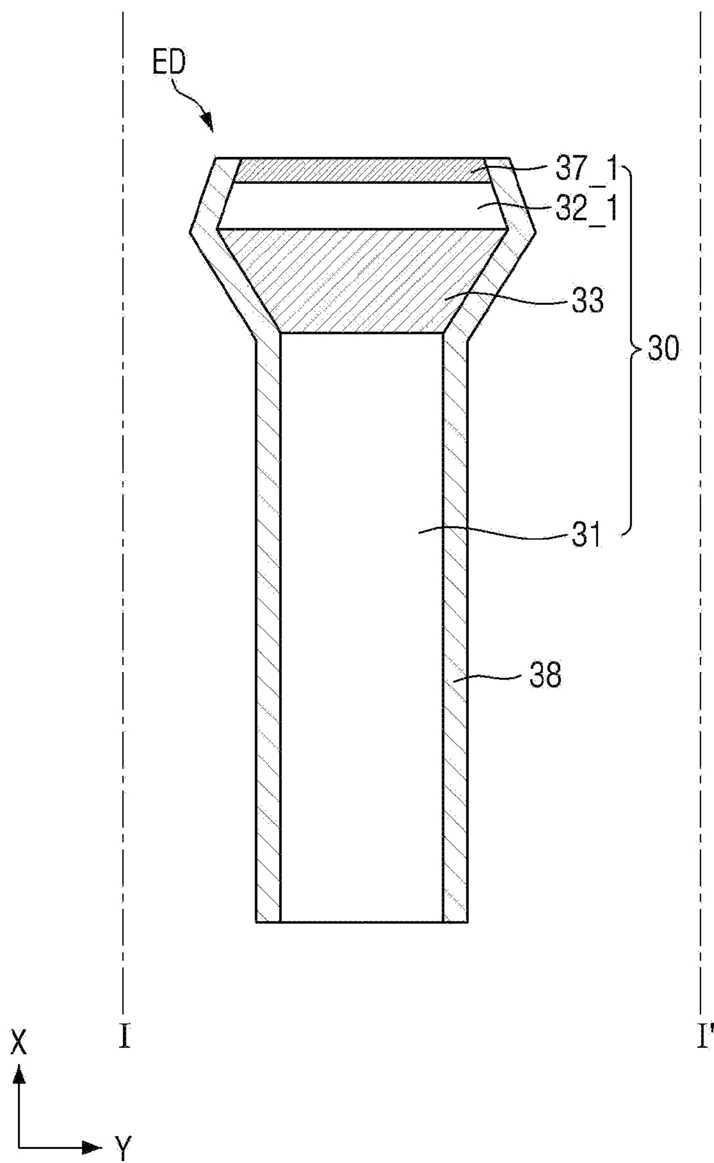
FIG. 13 is a cross-sectional view of the light emitting element of FIG. 1, and illustrates another example taken along the line I-I' of FIG. 1.
Figure 14:
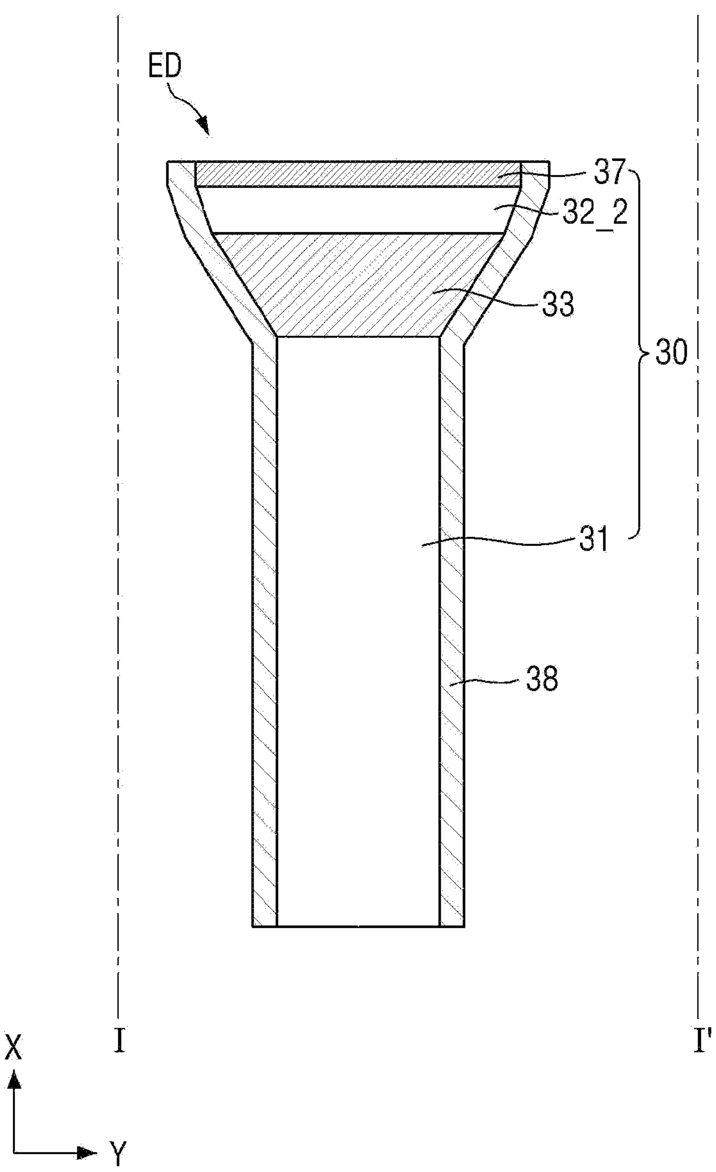
FIG. 14 is a cross-sectional view of the light emitting element of FIG. 1, and illustrates another example taken along the line I-I' of FIG. 1.

FIG. 13 is a cross-sectional view of the light emitting element of FIG. 1, and illustrates an example taken along the line I-I' of FIG. 1 according to one or more embodiments. FIG. 14 is a cross-sectional view of the light emitting element of FIG. 1, and illustrates an example taken along the line I-I' of FIG. 1 according to one or more embodiments.

Referring to FIG. 13, the light emitting element ED according to the present embodiment is different from that in the embodiment of FIG. 2 in that the diameters of a second semiconductor layer 32_1 and an element electrode layer 37_1 decrease along the one direction X.

For example, the diameter of the second semiconductor layer 32_1 may decrease along the one direction X. The side surface of the second semiconductor layer 32_1 may be inclined with respect to the bottom surface of the second semiconductor layer 32_1. An interior angle between the side surface of the second semiconductor layer 32_1 and the bottom surface of the second semiconductor layer 32_1 may be an acute angle. Similarly, the diameter of the element electrode layer 37_1 may decrease along the one direction X. The side surface of the element electrode layer 37_1 may be inclined with respect to the bottom surface of the element electrode layer 37_1. An interior angle between the side surface of the element electrode layer 37_1 and the bottom surface of the element electrode layer 37_1 may be an acute angle. The side surface of the second semiconductor layer 32_1 and the side surface of the element electrode layer 37_1 may be aligned in a line.

Referring to FIG. 14, the light emitting element ED according to the present embodiment is different from that in the embodiment of FIG. 2 in that the diameter of a second semiconductor layer 32_2 increases along the one direction X.

For example, the diameter of the second semiconductor layer 32_2 may increase along the one direction X (i.e., in an upward direction in FIG. 14). The side surface of the second semiconductor layer 32_2 may be inclined with respect to the bottom surface of the second semiconductor layer 32_2. An interior angle between the side surface of the second semiconductor layer 32_2 and the bottom surface of the second semiconductor layer 32_2 may be an obtuse angle. Accordingly, an exterior angle formed by the side surface of the second semiconductor layer 32_2 and the bottom surface of the second semiconductor layer 32_2 may be an acute angle.

Figure 15:
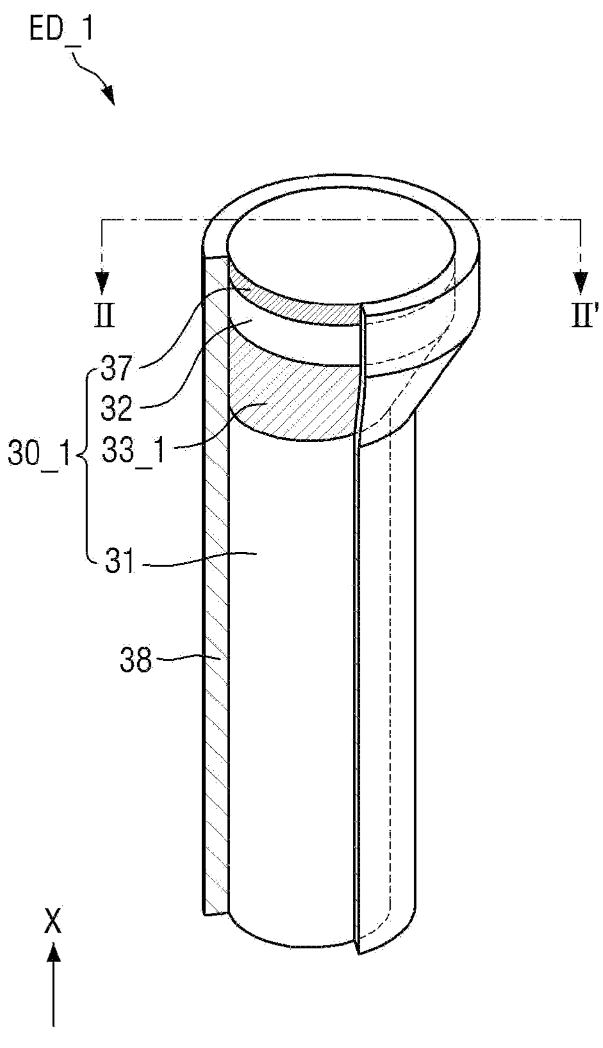
FIG. 15 is a schematic perspective cutaway view of a light emitting element according to one or more embodiments.
Figure 16:
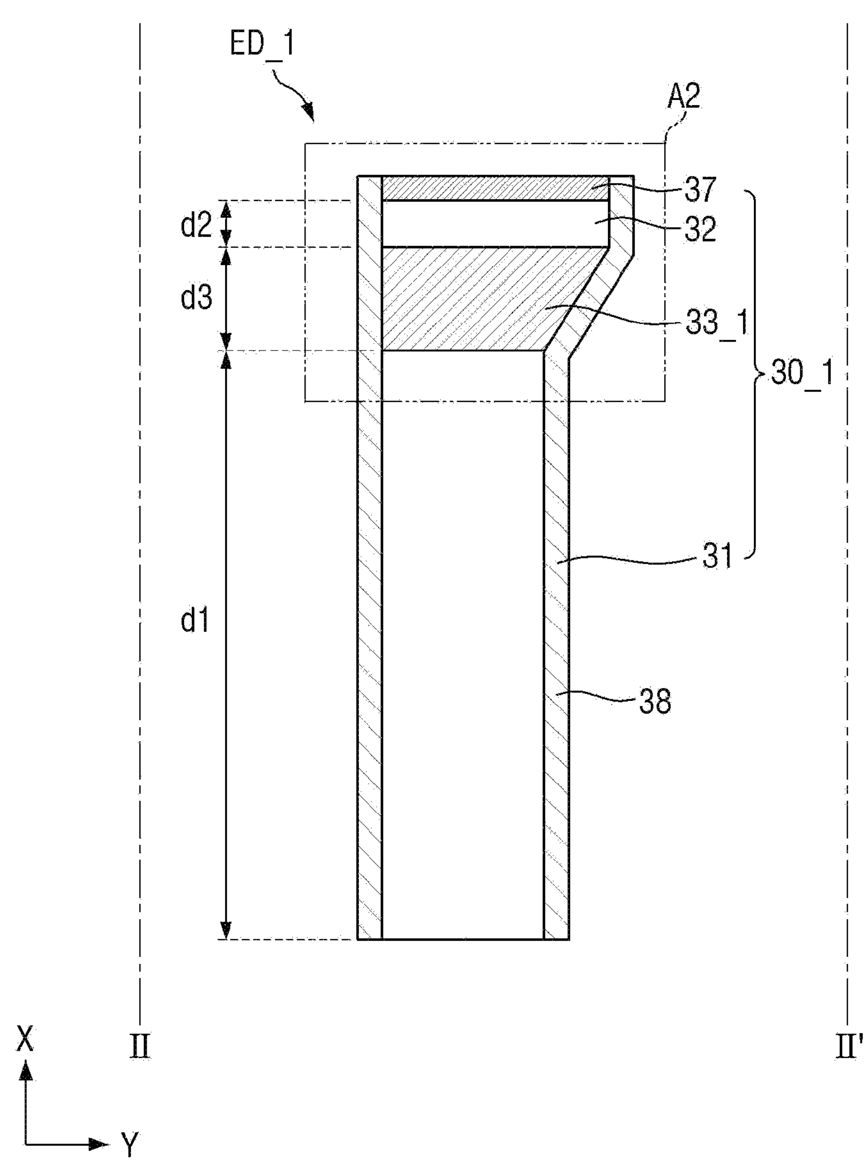
FIG. 16 is a cross-sectional view of the light emitting element of FIG. 15, and illustrates an example taken along the line II-II' of FIG. 15 according to one or more embodiments.
Figure 17:
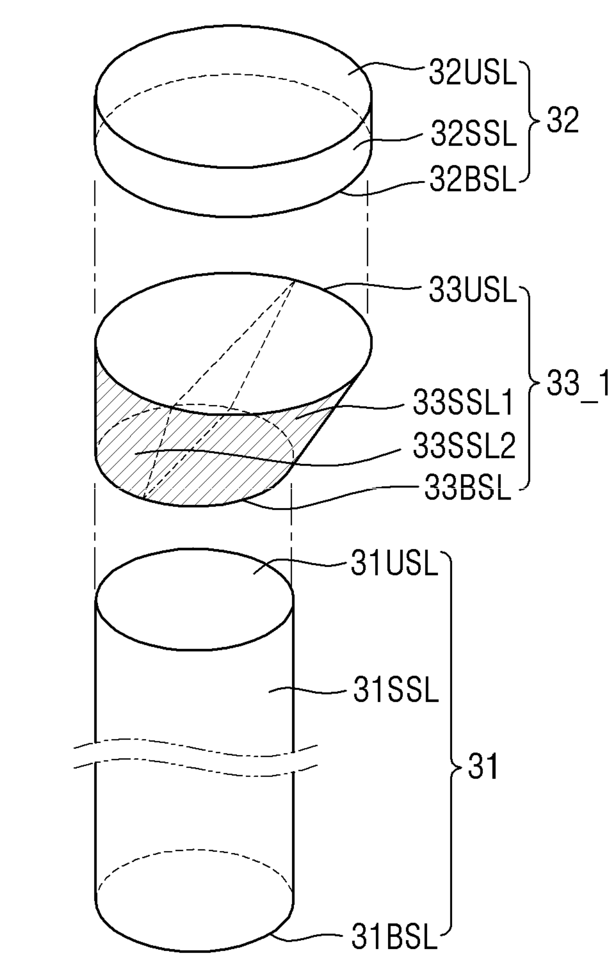
FIG. 17 is a schematic exploded perspective view illustrating an example of a first semiconductor layer, a second semiconductor layer, and an element active layer included in the light emitting element of FIG. 15 according to one or more embodiments.

FIG. 15 is a schematic perspective cutaway view of a light emitting element according to one or more embodiments. FIG. 16 is a cross-sectional view of the light emitting element of FIG. 15, and illustrates an example taken along the line II-II' of FIG. 15. FIG. 17 is a schematic exploded perspective view illustrating an example of a first semiconductor layer, a second semiconductor layer, and an element active layer included in the light emitting element of FIG. 15.

Referring to FIGS. 15 to 17, a light emitting element ED_1 according to the present embodiment may have an asymmetric shape with respect to a cross section traversing the central portion of a light emitting element core 30_1 in the one direction X. Accordingly, the plurality of semiconductor layers included in the light emitting element core 30_1 according to the present embodiment may have an asymmetric shape with respect to a cross section traversing the central portion of each semiconductor layer in the one direction X.

The first semiconductor layer 31 may have a shape extending along the one direction X. Although not limited to the following, the thickness d1 (or length) of the first semiconductor layer 31 in the one direction X may be greater than half the length of the light emitting element core 30_1. The diameter of the first semiconductor layer 31 may be substantially uniform along the one direction X.

The second semiconductor layer 32 may be spaced from the first semiconductor layer 31 with the element active layer 33 interposed therebetween. The thickness d2 (or length) of the second semiconductor layer 32 in the one direction X may be less than the thickness d1 of the first semiconductor layer 31. In one or more embodiments, the thickness d1 of the first semiconductor layer 31 may be greater than twice the thickness d2 of the second semiconductor layer 32. The diameter of the second semiconductor layer 32 may be substantially uniform along the one direction X.

An element active layer 33_1 may be disposed between the first semiconductor layer 31 and the second semiconductor layer 32. The thickness d3 (or length) of the element active layer 33_1 in the one direction X may be less than the thickness d1 of the first semiconductor layer 31. The thickness d1 of the first semiconductor layer 31 may be greater than the sum of the thickness d3 of the element active layer 33_1 and the thickness d2 of the second semiconductor layer 32.

The diameter of the element active layer 33_1 may increase along the one direction X. For example, the diameter of the element active layer 33_1 may increase from the first semiconductor layer 31 to the second semiconductor layer 32.

In the present embodiment, the element active layer 33_1 may have an asymmetric shape with respect to a cross section traversing the central portion of the element active layer 33_1 in the one direction X.

The side surface 33SSL of the element active layer 33_1 may include a first region 33SSL1 and a second region 33SSL2 depending on whether or not it is inclined with respect to the bottom surface of the element active layer 33_1. The first region 33SSL1 of the side surface 33SSL of the element active layer 33_1 may be a region inclined with respect to the bottom surface 33BSL of the element active layer 33_1, and the second region 33SSL2 of the side surface 33SSL of the element active layer 33_1 may be a region perpendicular (or substantially perpendicular) to the bottom surface 33BSL of the element active layer 33_1. That is, the side surface 33SSL of the element active layer 33_1 may include a partial region that is inclined with respect to the bottom surface 33BSL of the element active layer 33_1 and another partial region that is not inclined (or is perpendicular or substantially perpendicular) with respect to the bottom surface 33BSL of the element active layer 33_1, so that the element active layer 33_1 according to the present disclosure may have an asymmetric structure.

For example, the first region 33SSL1 of the side surface 33SSL of the element active layer 33_1 may be inclined with respect to the top surface 33USL of the element active layer 33_1 and/or the bottom surface 33BSL of the element active layer 33_1. Accordingly, the first region 33SSL1 of the side surface 33SSL of the element active layer 33_1 may be inclined with respect to each of the side surface 31SSL of the first semiconductor layer 31 and the side surface 32SSL of the second semiconductor layer 32.

The second region 33SSL2 of the side surface 33SSL of the element active layer 33_1 may be perpendicular (or substantially perpendicular) to the top surface 33USL of the element active layer 33_1 and/or the bottom surface 33BSL of the element active layer 33_1. Accordingly, the second region 33SSL2 of the side surface 33SSL of the element active layer 33_1 may be aligned in a line with the side surface 31SSL of the first semiconductor layer 31 and the side surface 32SSL of the second semiconductor layer 32.

Figure 18:
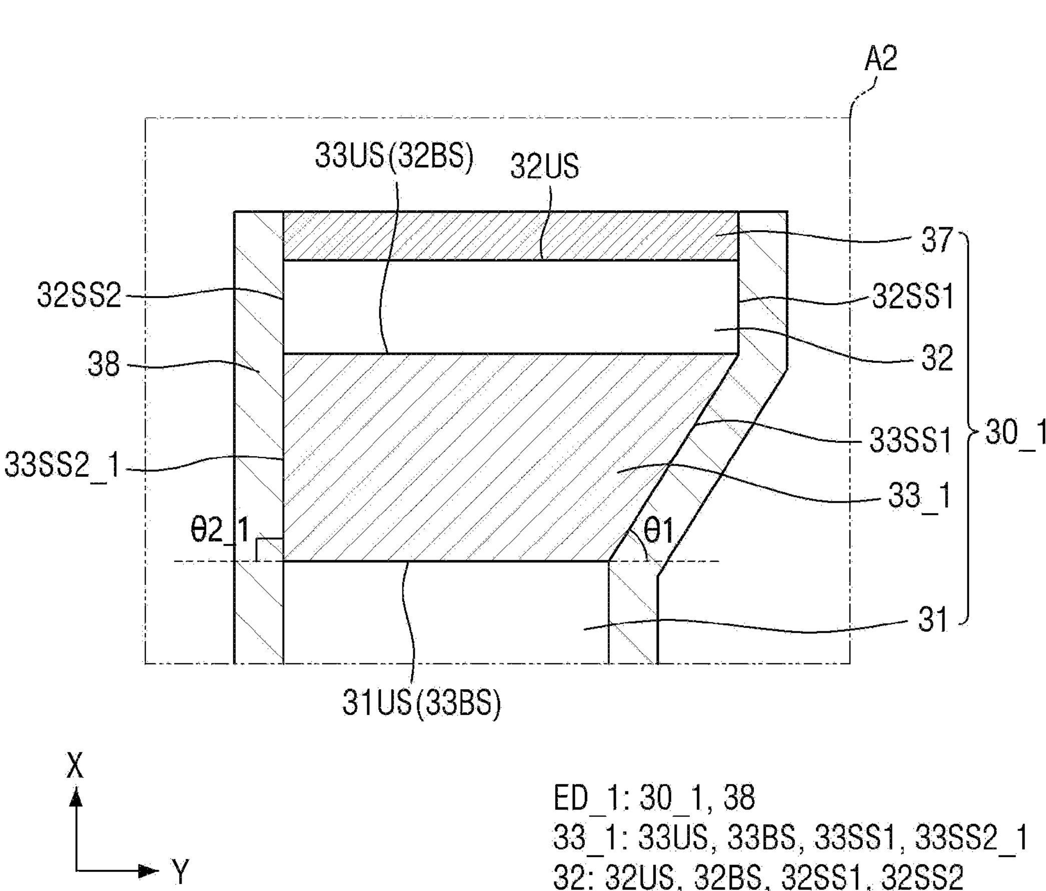
FIG. 18 is an enlarged cross-sectional view illustrating an example of an area A2 of FIG. 16 according to one or more embodiments.
Figure 18:
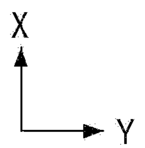

FIG. 18 is an enlarged cross-sectional view illustrating an example of an area A2 of FIG. 16 according to one or more embodiments.

Referring to FIG. 18, the first lateral side 33SS1 of the element active layer 33_1 may be positioned in the first region 33SSL1 of the side surface 33SSL of the element active layer 33_1 of FIG. 17, and a second lateral side 33SS2_1 of the element active layer 33_1 may be positioned in the second region 33SSL2 of the side surface 33SSL of the element active layer 33_1 of FIG. 17.

The first lateral side 33SS1 of the element active layer 33_1 may be inclined with respect to the first side 33US of the element active layer 33_1 and the second side 33BS of the element active layer 33_1. The first lateral side 33SS1 of the element active layer 33_1 may be inclined at an obtuse angle with respect to the second side 33BS of the element active layer 33_1. The first lateral side 33SS1 of the element active layer 33_1 may be inclined with a first exterior angle θ1 with respect to the second side 33BS of the element active layer 33_1. The size of the first exterior angle 81 formed by the second side 33BS of the element active layer 33_1 and the first lateral side 33SS1 of the element active layer 33_1 may be included in the range of 55° to 75° or 57° to 73°, and in one or more embodiments in the range of 60° to 73°.

In the present embodiment, the second lateral side 33SS2_1 of the element active layer 33_1 may be perpendicular (or substantially perpendicular) to the first side 33US of the element active layer 33_1 and the second side 33BS of the element active layer 33_1. That is, a second exterior angle θ2_1 formed by the second lateral side 33SS2_1 of the element active layer 33_1 and the second side 33BS of the element active layer 33_1 may be 90° (or right angle).

In one or more embodiments, the size of the first exterior angle θ1 and the size of the second exterior angle θ2_1 may be different from each other. That is, the element active layer 33_1 may have an asymmetric shape with respect to a cross section traversing the central portion of the element active layer 33_1 in the one direction X. Alternatively, the cross section of the element active layer 33_1 may be asymmetric with respect to a reference line passing through the central portion of the element active layer 33_1 and extending in the one direction X. Accordingly, the first lateral side 33SS1 of the element active layer 33_1 and the second lateral side 33SS2_1 of the element active layer 33_1 may have an asymmetric relationship with respect to a reference line passing through the central portion of the element active layer 33_1 and extending in the one direction X.

The first lateral side 33SS1 of the element active layer 33_1 may be inclined with respect to the first lateral side 32SS1 of the second semiconductor layer 32. The first lateral side 33SS1 of the element active layer 33_1 may be inclined with respect to one lateral side of the first semiconductor layer 31.

The second lateral side 33SS2_1 of the element active layer 33_1 may be aligned with the second lateral side 32SS2 of the second semiconductor layer 32. The second lateral side 33SS2_1 of the element active layer 33_1 may be aligned with the other lateral side of the first semiconductor layer 31.

Figure 19:
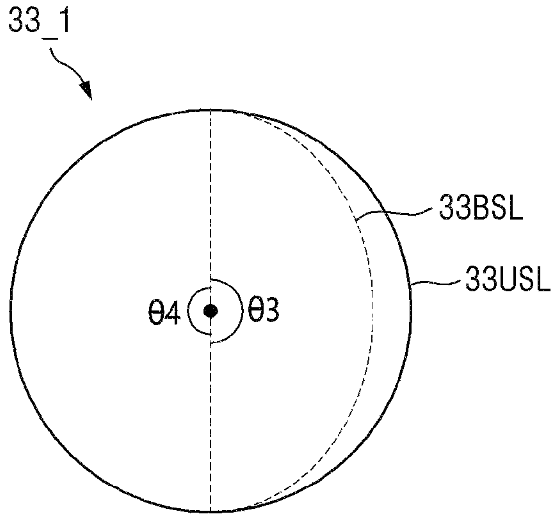
FIG. 19 is a plan view showing an example of a relative planar arrangement between a first surface and a second surface of an element active layer included in the light emitting element of FIG. 15 according to one or more embodiments.
Figure 20:
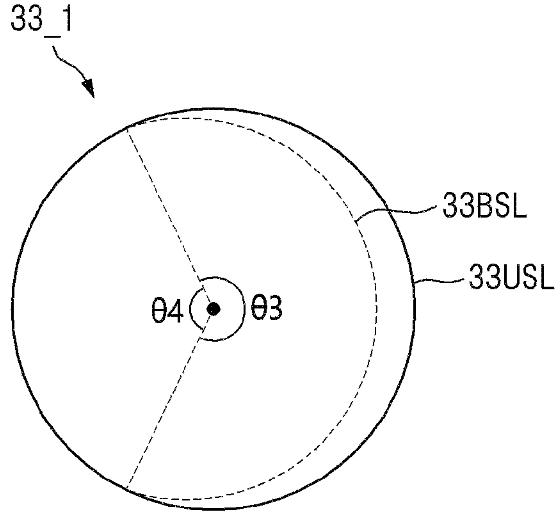
FIG. 20 is a plan view showing another example of a relative planar arrangement between a first surface and a second surface of an element active layer included in the light emitting element of FIG. 15 according to one or more embodiments.
Figure 21:
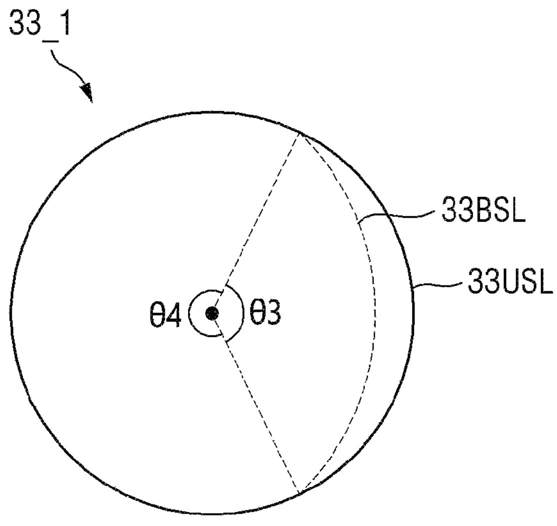
FIG. 21 is a plan view showing still another example of a relative planar arrangement between a first surface and a second surface of an element active layer included in the light emitting element of FIG. 15 according to one or more embodiments.

FIG. 19 is a plan view showing an example of a relative planar arrangement between a first surface and a second surface of an element active layer included in the light emitting element of FIG. 15 according to one or more embodiments. FIG. 20 is a plan view showing an example of a relative planar arrangement between a first surface and a second surface of an element active layer included in the light emitting element of FIG. 15 according to one or more embodiments. FIG. 21 is a plan view showing an example of a relative planar arrangement between a first surface and a second surface of an element active layer included in the light emitting element of FIG. 15 according to one or more embodiments.

FIGS. 19 to 21 are diagrams illustrating a relative planar arrangement relationship between the first surface 33USL (e.g., the top surface) and the second surface 33BSL (e.g., the bottom surface) of the element active layer 33_1. FIGS. 19 to 21 show relative planar arrangements between the top surface 33USL and the bottom surface 33BSL of the various element active layers 33_1 depending on the sizes of the first region 33SSL1 and the second region 33SSL2 of the side surfaces 33SSL of the element active layer 33_1 described above.

Referring to FIGS. 17 and 19, the top surface 33USL of the element active layer 33_1 may completely cover the bottom surface 33BSL of the element active layer 33_1 in a plan view. In a plan view, when the outer circumference of the top surface 33USL of the element active layer 33_1 coincides with the outer circumference of the bottom surface 33BSL of the element active layer 33_1, the side surface 33SSL of the element active layer 33_1 connecting the top surface 33USL of the element active layer 33_1 to the bottom surface 33BSL of the element active layer 33_1 may be perpendicular to the bottom surface 33BSL of the element active layer 33_1. In a plan view, when the outer circumference of the bottom surface 33BSL of the element active layer 33_1 is positioned inside the outer circumference of the top surface 33USL of the element active layer 33_1, the side surface 33SSL of the element active layer 33_1 connecting the top surface 33USL of the element active layer 33_1 to the bottom surface 33BSL of the element active layer 33_1 may be inclined to have an acute exterior angle with respect to the bottom surface 33BSL of the element active layer 33_1.

The outer circumference of the bottom surface 33BSL of the element active layer 33_1 may include a first portion that is positioned more inward than the outer circumference of the top surface 33USL of the element active layer 33_1, and a second portion that coincides with the outer circumference of the top surface 33USL of the element active layer 33_1.

In the element active layer 33_1 of FIG. 19, with respect to the central axis of the top surface 33USL of the element active layer 33_1, a central angle θ3 of the first portion and a central angle θ4 of the second portion included in the outer circumference of the bottom surface 33BSL of the element active layer 33_1 may each be 180°.

In the element active layer 33_1 of FIG. 20, with respect to the central axis of the top surface 33USL of the element active layer 33_1, a central angle θ3 of the first portion included in the outer circumference of the bottom surface 33BSL of the element active layer 33_1 may be greater than a central angle θ4 of the second portion thereof. The sum of the central angle θ3 of the first portion and the central angle θ4 of the second portion may be 360°.

In the element active layer 33_1 of FIG. 21, with respect to the central axis of the top surface 33USL of the element active layer 33_1, a central angle θ3 of the first portion included in the outer circumference of the bottom surface 33BSL of the element active layer 33_1 may be less than a central angle θ4 of the second portion thereof. The sum of the central angle θ3 of the first portion and the central angle θ4 of the second portion may be 360°.

FIG. 22 is a plan view of a display device according to one or more embodiments.

Referring to FIG. 22, the display device 10 displays a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. Hereinafter, as one example of the display panel, a case in which the above-described light emitting element ED or ED_1, for example, an inorganic light emitting diode display panel is applied will be exemplified. However, the present disclosure is not limited thereto, and may be applied to other display devices as long as the same technical spirit is applicable.

Hereinafter, a fourth direction DR4, a fifth direction DR5, and a sixth direction DR6 are defined in drawings of an embodiment describing the display device 10. The fourth direction DR4 and the fifth direction DR5 may be directions perpendicular to each other in one plane. The sixth direction DR6 may be a direction perpendicular to a plane on which the fourth direction DR4 and the fifth direction DR5 are located. The sixth direction DR6 is perpendicular to each of the fourth direction DR4 and the fifth direction DR5. In the embodiment describing the display device 10, the sixth direction DR6 indicates a thickness direction of the display device 10.

The display device 10 may have a rectangular shape including long and short sides such that the side in the fourth direction DR4 is longer than the side in the fifth direction DR5 in a plan view. A corner portion where the long side and the short side of the display device 10 meet may form a right angle in a plan view, but is not limited thereto. For example, the corner portion where the long side and the short side of the display device 10 meet may have a rounded curved shape in a plan view. The planar shape of the display device 10 is not limited to the illustrated example, and may be other shapes such as a square shape, a quadrilateral shape with rounded corners (vertices), other polygonal shapes and a circular shape.

A display surface of the display device 10 may be disposed on one side of the sixth direction DR6 which is the thickness direction. In embodiments describing the display device 10, unless otherwise noted, the term "upward" refers to one side of the sixth direction DR6, which is the display direction, and the term "top surface" refers to a surface toward the one side of the sixth direction DR6. Further, the term "downward" refers to the other side of the sixth direction DR6, which is an opposite direction to the display direction, and the term "bottom surface" refers to a surface toward the other side of the sixth direction DR6. Furthermore, "left", "right", "upper" and "lower" indicate directions when the display device 10 is viewed from above. For example, "right side" indicates one side of the fourth direction DR4, "left side" indicates the other side of the fourth direction DR4, "upper side" indicates one side of the fifth direction DR5, and "lower side" indicates the other side of the fifth direction DR5.

The display device 10 may include the display area DPA and a non-display area NDA around (or surrounding) the display area DPA along the edge or periphery of the display area DPA. The display area DPA is an area where an image can be displayed, and the non-display area NDA is an area where an image is not displayed.

The shape of the display area DPA may follow the shape of the display device 10. For example, the shape of the display area DPA may have a rectangular shape similar to the overall shape of the display device 10 in a plan view. The display area DPA may substantially occupy the center (or central region) of the display device 10.

The display area DPA may include a plurality of pixels PX. The plurality of pixels PX may be arranged in a matrix. For example, the plurality of pixels PX may be arranged along the rows and columns of a matrix. The shape of each pixel PX may be a rectangular or square shape in a plan view. However, the shape of each pixel PX is not limited thereto, and may be a rhombus shape in which each side is inclined with respect to one direction. The pixels PX may be alternately disposed in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

The non-display area NDA may be disposed around the display area DPA. The non-display area NDA may completely or partially surround the display area DPA. In one or more embodiments, the display area DPA may have a rectangular shape, and the non-display area NDA may be disposed adjacent to four sides of the display area DPA. The non-display area NDA may form a bezel of the display device 10. In the non-display area NDA, wires, circuit drivers, or pad portions on which an external device is mounted may be disposed in the display device 10.

Figure 23:
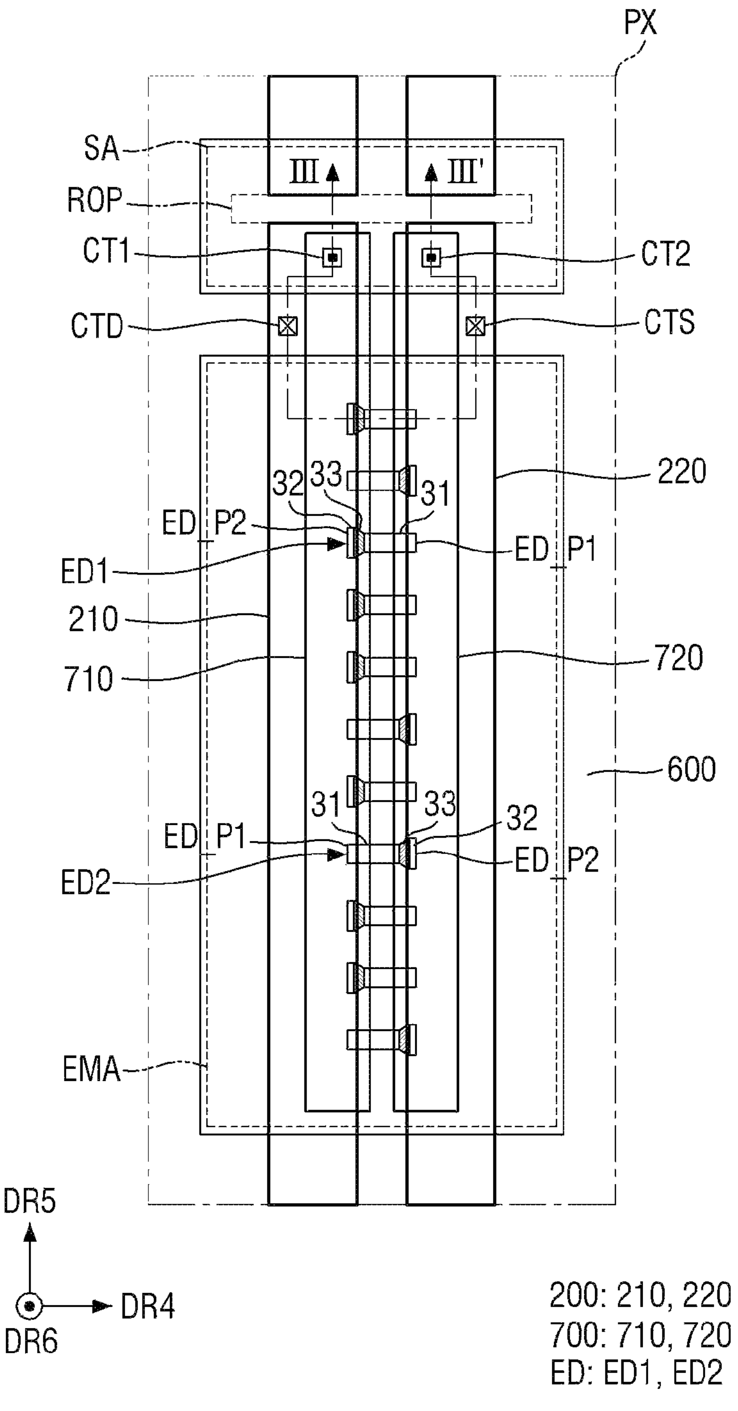
FIG. 23 is a plan layout view illustrating one pixel of a display device according to one or more embodiments.

FIG. 23 is a plan layout view illustrating one pixel of a display device according to one or more embodiments.

Referring to FIG. 23, each pixel PX of the display device 10 may include an emission area EMA and a non-emission area. The emission area EMA may be defined as an area in which light emitted from a light emitting element ED is emitted, and the non-emission area may be defined as an area in which light is not emitted because the light emitted from the light emitting element ED does not reach the non-emission area.

The emission area EMA may include an area in which the light emitting element ED is disposed and an area adjacent thereto. In addition, the emission area EMA may further include a region in which the light emitted from the light emitting element ED is reflected or refracted by another member and emitted.

Each pixel PX may further include a sub-region SA disposed in the non-emission area. The light emitting element ED may not be provided in the sub-region SA. The sub-region SA may be disposed on one side or the other side of the emission area EMA in the fifth direction DR5 in one pixel PX in a plan view. For example, the sub-region SA may be disposed above the emission area EMA in one pixel PX in a plan view. The sub-region SA may be disposed between the emission areas EMA of the pixels PX adjacent to each other in the fifth direction DR5.

The sub-region SA may include a region in which an electrode layer 200 and a contact electrode 700 are electrically connected to each other through contact portions CT1 and CT2.

The sub-region SA may include a separation portion ROP. The separation portion ROP may be a region where the first electrodes 210 of the electrode layers 200 included in the pixels PX adjacent along the fifth direction DR5 are separated from each other, and the second electrodes 220 of the electrode layers 200 included in the pixels PX adjacent along the fifth direction DR5 are separated from each other.

Figure 24:
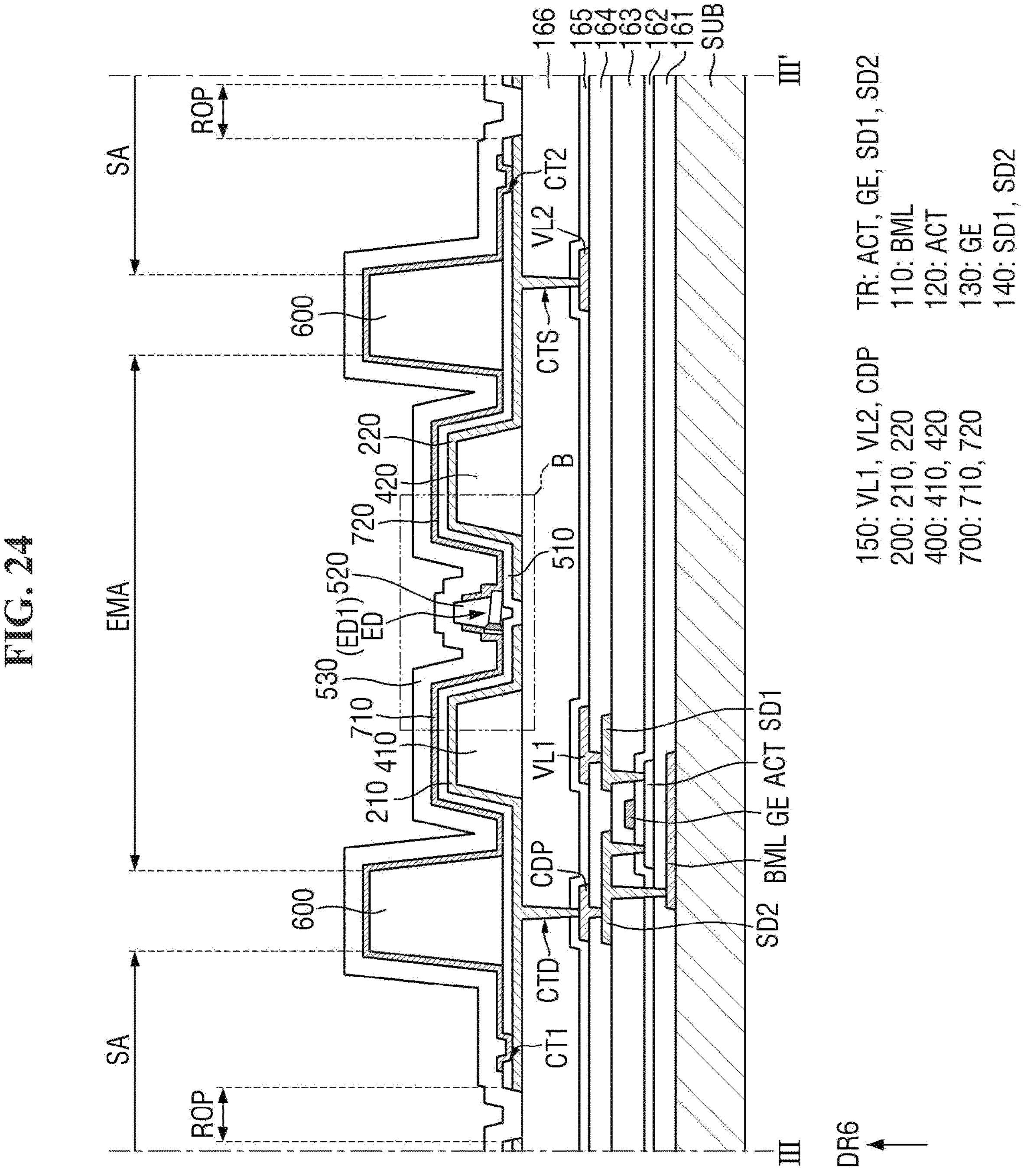
FIG. 24 is a cross-sectional view illustrating an example taken along the line III-III' of FIG. 23 according to one or more embodiments.

FIG. 24 is a cross-sectional view illustrating an example taken along the line III-III' of FIG. 23 according to one or more embodiments.

Referring to FIGS. 23 and 24, the display device 10 may include a substrate SUB, a circuit element layer disposed on the substrate SUB, and a light emitting element layer disposed on the circuit element layer.

The substrate SUB may be an insulating substrate. The substrate SUB may be made of an insulating material such as glass, quartz, or polymer resin. Further, the substrate SUB may be a rigid substrate, but may also be a flexible substrate which can be bent, folded or rolled.

The circuit element layer may be disposed on the substrate SUB. The circuit element layer may include a lower metal layer 110 or BML, a semiconductor layer 120 or ACT, a first conductive layer 130 or GE, a second conductive layer 140 including SD1 and SD2, a third conductive layer 150 including VL1, VL2, and CDP, and a plurality of insulating layers.

The lower metal layer 110 is disposed on the substrate SUB. The lower metal layer 110 may include a light blocking pattern BML. The light blocking pattern BML may be disposed to cover at least the channel region of the active layer ACT of the transistor TR from the bottom or in the sixth direction DR6. However, the present disclosure is not limited thereto, and the light blocking pattern BML may be omitted.

The lower metal layer 110 may contain a material that blocks light. For example, the lower metal layer 110 may be made of an opaque metal material that blocks transmission of light.

A buffer layer 161 may be disposed on the lower metal layer 110. The buffer layer 161 may be disposed to completely cover the substrate SUB on which the lower metal layer 110 is provided. The buffer layer 161 may serve to protect a plurality of transistors from moisture permeating through the substrate SUB that is susceptible to moisture permeation.

The semiconductor layer 120 is disposed on the buffer layer 161. The semiconductor layer 120 may include the active layer ACT of the transistor TR. The active layer ACT of the transistor TR may be disposed to overlap the light blocking pattern BML of the lower metal layer 110 in the sixth direction DR6, as described above.

The semiconductor layer 120 may include polycrystalline silicon, monocrystalline silicon, an oxide semiconductor, or the like. In one or more embodiments, when the semiconductor layer 120 contains polycrystalline silicon, the polycrystalline silicon may be formed by crystallizing amorphous silicon. When the semiconductor layer 120 contains polycrystalline silicon, the active layer ACT of the transistor TR may include a plurality of doping regions doped with impurities and channel regions disposed therebetween. In one or more embodiments, the semiconductor layer 120 may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

A gate insulating layer 162 may be disposed on the semiconductor layer 120 and the buffer layer 161. The gate insulating layer 162 may function as a gate insulating layer of the transistor TR. The gate insulating layer 162 may be formed as a multilayer in which inorganic layers including an inorganic material, for example, at least one of silicon oxide (SiOx), silicon nitride (SiNx) or silicon oxynitride (SiOxNy) are alternately stacked.

The first conductive layer 130 may be disposed on the gate insulating layer 162. The first conductive layer 130 may include a gate electrode GE of the transistor TR. The gate electrode GE may be disposed to overlap the channel region of the active layer ACT in the sixth direction DR6 which is the thickness direction of the substrate SUB.

A first interlayer insulating layer 163 may be disposed on the first conductive layer 130 and the gate insulating layer 162. The first interlayer insulating layer 163 may be disposed to cover the gate electrode GE. The first interlayer insulating layer 163 may function as an insulating layer between the first conductive layer 130 and other layers disposed thereon to protect the first conductive layer 130.

A second conductive layer 140 may be disposed on the first interlayer insulating layer 163. The second conductive layer 140 may include a drain electrode SD1 of the transistor TR and a source electrode SD2 of the transistor TR.

The drain electrode SD1 and the source electrode SD2 of the transistor TR may be electrically connected to both ends of the active layer ACT of the transistor TR through contact holes penetrating the first interlayer insulating layer 163 and the gate insulating layer 162. Further, the source electrode SD2 of the transistor TR may be electrically connected to the light blocking pattern BML of the lower metal layer 110 through another contact hole penetrating the first interlayer insulating layer 163, the gate insulating layer 162, and the buffer layer 161.

A second interlayer insulating layer 164 may be disposed on the second conductive layer 140 and the first interlayer insulating layer 163. The second interlayer insulating layer 164 may be disposed to cover the drain electrode SD1 of the transistor TR and the source electrode SD2 of the transistor TR. The second interlayer insulating layer 164 may function as an insulating layer between the second conductive layer 140 and other layers disposed thereon, and may protect the second conductive layer 140.

A third conductive layer 150 may be disposed on the second interlayer insulating layer 164. The third conductive layer 150 may include a first voltage line VL1, a second voltage line VL2, and a conductive pattern CDP.

The first voltage line VL1 may overlap at least a part of the drain electrode SD1 of the transistor TR in the thickness direction of the substrate SUB or the sixth direction DR6. A high potential voltage (or a first source voltage) supplied to the transistor TR may be applied to the first voltage line VL1.

The second voltage line VL2 may be disposed to be spaced from the first voltage line VL1 on the second interlayer insulating layer 164. The second voltage line VL2 may be electrically connected to the second electrode 220 through the second electrode contact hole CTS penetrating a via layer 166 and a passivation layer 165 to be described below. A low potential voltage (or a second source voltage) lower than the high potential voltage supplied to the first voltage line VL1 may be applied to the second voltage line VL2. That is, the high potential voltage (or the first power voltage) supplied to the transistor TR may be applied to the first voltage line VL1, and the low potential voltage (or the second power voltage) lower than the high potential voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR through the contact hole penetrating the second interlayer insulating layer 164. Further, the conductive pattern CDP may be electrically connected to the first electrode 210 through the first electrode contact hole CTD penetrating the via layer 166 and the passivation layer 165 to be described later.

The passivation layer 165 may be disposed on the third conductive layer 150 and the second interlayer insulating layer 164. The passivation layer 165 may be disposed to cover the third conductive layer 150. The passivation layer 165 may serve to protect the third conductive layer 150.

Each of the buffer layer 161, the first gate insulating layer 162, the first interlayer insulating layer 163, the second interlayer insulating layer 164, and the passivation layer 165 described above may be formed of a plurality of inorganic layers stacked in an alternating manner. For example, the buffer layer 161, the gate insulating layer 162, the first interlayer insulating layer 163, the second interlayer insulating layer 164, and the passivation layer 165 described above may be formed as a double layer formed by stacking, or a multilayer formed by alternately stacking, inorganic layers including at least one of silicon oxide (SiOx), silicon nitride (SiNx), or silicon oxynitride (SiOxNy). However, the present disclosure is not limited thereto, and the buffer layer 161, the gate insulating layer 162, the first interlayer insulating layer 163, the second interlayer insulating layer 164, and the passivation layer 165 described above may be formed as a single inorganic layer containing the above-described insulating material.

The via layer 166 may be disposed on the passivation layer 165. The via layer 166 may include an organic insulating material, for example, an organic material such as polyimide (PI). The via layer 166 may function to flatten a surface. Accordingly, the top surface (or the surface) of the via layer 166, on which the light emitting element layer to be described later is disposed, may be substantially flat regardless of a shape or presence of a pattern disposed thereunder.

The light emitting element layer may be disposed on the circuit element layer. The light emitting element layer may be disposed on the via layer 166. The light emitting element layer may include a first bank 400, the electrode layer 200, a first insulating layer 510, a second bank 600, the plurality of light emitting elements ED, a second insulating layer 520, the contact electrode 700, and a third insulating layer 530.

The first bank 400 may be disposed on the via layer 166 in the emission area EMA. The first bank 400 may be disposed directly on one surface of the via layer 166. The first bank 400 may have a structure in which at least a part of the first bank 400 protrudes upward (e.g., one side in the sixth direction DR6) with respect to one surface of the via layer 166. The protruding part of the first bank 400 may have an inclined side surface. The first bank 400 may serve to change the traveling direction of the light emitted from the light emitting element ED toward the inclined side surface of the first bank 400 to an upward direction (e.g., a display direction).

The first bank 400 may include the first sub-bank 410 and the second sub-bank 420. The first sub-bank 410 and the second sub-bank 420 may each extend in the fifth direction DR5 and may be spaced from each other in the fourth direction DR4. The first sub-bank 410 and the second sub-bank 420, which are spaced from each other, may provide a space in which the light emitting element ED is disposed, while assisting the function of a reflective partition wall that changes the traveling direction of the light emitted from the light emitting element ED to the display direction.

Although it is illustrated in the drawing that the side surface of the first bank 400 is in a linear shape, the present disclosure is not limited thereto. However, the present disclosure is not limited thereto. For example, the side surface (or outer surface) of the first bank 400 may have a curved semicircular or semi-elliptical shape. In one or more embodiments, the first bank 400 may include an organic insulating material such as polyimide (PI), but is not limited thereto.

The electrode layer 200 may have a shape extending in one direction and may be disposed to cross the emission area EMA and the sub-region SA. The electrode layer 200 may transmit an electrical signal applied from the circuit element layer to the light emitting element ED in order for the light emitting element ED to emit light. In addition, the electrode layer 200 may be used to generate an electric field used in a step of aligning the plurality of light emitting elements ED.

The electrode layer 200 may be disposed on the first bank 400 and the via layer 166 exposed by the first bank 400. In the emission area EMA, the electrode layer 200 may be disposed on the first bank 400 and the via layer 166 exposed by the first bank 400, and in the non-emission area, the electrode layer 200 may be disposed on the via layer 166 exposed by the first bank 400.

The electrode layer 200 may include the first electrode 210 and the second electrode 220. The first electrode 210 and the second electrode 220 may be spaced from each other.

The first electrode 210 may be located on the left side of each pixel PX in a plan view. The first electrode 210 may have a shape extending in the fifth direction DR5 in a plan view. The first electrode 210 may be disposed to cross the emission area EMA and the sub-region SA. The first electrode 210 may extend in the fifth direction DR5 in a plan view and may be separated from the first electrode 210 of the pixel PX adjacent thereto in the fifth direction DR5 at the separation portion ROP of the sub-region SA.

The second electrode 220 may be spaced from the first electrode 210 in the fourth direction DR4. The second electrode 220 may be located on the right side of each pixel PX in a plan view. The second electrode 220 may have a shape extending in the fifth direction DR5 in a plan view. The second electrode 220 may be disposed to cross the emission area EMA and the sub-region SA. The second electrode 220 may extend in the fifth direction DR5 in a plan view and may be separated from the second electrode 220 of the pixel PX adjacent thereto in the fifth direction DR5 at the separation portion ROP of the sub-region SA.

For example, the first electrode 210 may be disposed on the first sub-bank 410, and the second electrode 220 may be disposed on the second sub-bank 420 in the emission area EMA. The first electrode 210 may extend outward from the first sub-bank 410 and may also be disposed on the via layer 166 exposed by the first sub-bank 410. Similarly, the second electrode 220 may extend outward from the second sub-bank 420 and may also be disposed on the via layer 166 exposed by the second sub-bank 420. The first electrode 210 and the second electrode 220 may be opposite to and spaced from each other in a region where the first sub-bank 410 and the second sub-bank 420 are opposite to and spaced from each other. The via layer 166 may be exposed in a region where the first electrode 210 and the second electrode 220 face (or oppose) each other while being spaced from each other.

The first electrode 210 may be spaced from a first electrode 210 of another pixel PX adjacent in the fifth direction DR5 with the separation portion ROP interposed therebetween in the sub-region SA. Similarly, the second electrode 220 may be spaced from a second electrode 220 of another pixel PX adjacent in the fifth direction DR5 with the separation portion ROP interposed therebetween in the sub-region SA. Accordingly, the first electrode 210 and the second electrode 220 may expose the via layer 166 in the separation portion ROP of the sub-region SA.

The first electrode 210 may be electrically connected to the conductive pattern CDP of the circuit element layer through the first electrode contact hole CTD penetrating the via layer 166 and the passivation layer 165. For example, the first electrode 210 may be in contact with the top surface of the conductive pattern CDP exposed by the first electrode contact hole CTD. The first power voltage applied from the first voltage line VL1 may be transferred to the first electrode 210 through the conductive pattern CDP via the transistor TR.

The second electrode 220 may be electrically connected to the second voltage line VL2 of the circuit element layer through the second electrode contact hole CTS penetrating the via layer 166 and the passivation layer 165. For example, the second electrode 220 may be in contact with the top surface of the second voltage line VL2 exposed by the second electrode contact hole CTS. The second source voltage applied from the second voltage line VL2 may be transmitted to the second electrode 220.

The electrode layer 200 may include a conductive material having high reflectivity. For example, the electrode layer 200 may include a metal such as silver (Ag), copper (Cu), or aluminum (Al) as a material having high reflectivity, or may include an alloy including aluminum (Al), nickel (Ni), lanthanum (La), and the like. The electrode layer 200 may reflect the light emitted from the light emitting element ED and traveling toward the side surface of the first bank 400 in the upward direction of each pixel PX.

However, the present disclosure is not limited thereto, and the electrode layer 200 may further include a transparent conductive material. For example, the electrode layer 200 may include a material such as ITO, IZO, and ITZO. In one or more embodiments, the electrode layer 200 may have a structure in which at least one transparent conductive material and at least one metal layer having high reflectivity are stacked, or may be formed as one layer including them. For example, the electrode layer 200 may have a stacked structure of ITO/Ag/ITO, ITO/Ag/IZO, ITO/Ag/ITZO/IZO, or the like.

The first insulating layer 510 may be disposed on the via layer 166 on which the electrode layer 200 is formed. The first insulating layer 510 may protect the electrode layer 200 while insulating the first electrode 210 from the second electrode 220.

The first insulating layer 510 may include an inorganic insulating material. For example, the first insulating layer 510 may include at least one of inorganic insulating materials such as silicon oxide (SiOx), silicon nitride (SiNx), silicon oxynitride (SiOxNy), aluminum oxide (AlxOy), aluminum nitride (AlN), and the like.

The first insulating layer 510 may include a first contact portion CT1 exposing a part of the top surface of the first electrode 210 in the sub-region SA and a second contact portion CT2 exposing a part of the top surface of the second electrode 220 in the sub-region SA. The first electrode 210 may be electrically connected to a first contact electrode 710 to be described later through the first contact portion CT1 penetrating the first insulating layer 510 in the sub-region SA, and the second electrode 220 may be electrically connected to a second contact electrode 720 to be described later through the second contact portion CT2 penetrating the first insulating layer 510 in the sub-region SA.

The second bank 600 may be disposed on the first insulating layer 510. The second bank 600 may include portions extending in the fourth and fifth directions DR4 and DR5 in a plan view, and may be disposed in the form of a grid pattern in a plan view.

The second bank 600 may be disposed across the boundary of adjacent pixels PX to divide the pixels PX and may divide the emission area EMA and the sub-region SA. Further, the second bank 600 is formed to have a height greater than that of the first bank 400 in the sixth direction DR6. Accordingly, in an inkjet printing step for aligning the light emitting elements ED during the fabricating process of the display device 10, ink in which the plurality of light emitting elements ED are dispersed can be sprayed into the emission area EMA without being mixed with an adjacent pixel PX.

The plurality of light emitting elements ED may be arranged in the emission area EMA. The plurality of light emitting elements ED may not be disposed in the sub-region SA.

The plurality of light emitting elements ED may be disposed on the first insulating layer 510 between the first sub-bank 410 and the second sub-bank 420. The plurality of light emitting elements ED may be disposed on the first insulating layer 510 between the first electrode 210 and the second electrode 220.

The light emitting element ED may have a shape extending in one direction, and both ends of the light emitting element ED may be disposed above the first electrode 210 and the second electrode 220, respectively. For example, the plurality of light emitting elements ED may be disposed such that one end thereof is placed on the first electrode 210 and the other end thereof is placed on the second electrode 220.

The length of each light emitting element ED (i.e., the length of the light emitting element ED in the fourth direction DR4 in the drawing) may be less than the shortest distance between the first sub-bank 410 and the second sub-bank 420 spaced from each other in the fourth direction DR4. In addition, the length of each light emitting element ED may be greater than the shortest distance between the first electrode 210 and the second electrode 220 spaced in the fourth direction DR4. A distance in the fourth direction DR4 between the first sub-bank 410 and the second sub-bank 420 may be formed to be greater than the length of each light emitting element ED, and the distance in the fourth direction DR4 between the first electrode 210 and the second electrode 220 may be formed to be less than the length of each light emitting element ED, so that the plurality of light emitting elements ED may be disposed such that both ends thereof are placed above the first electrode 210 and the second electrode 220, respectively, between the first sub-bank 410 and the second sub-bank 420.

The plurality of light emitting elements ED may be arranged to be spaced from each other along the fifth direction DR5 in which the first electrode 210 and the second electrode 220 extend, and may be aligned substantially parallel to each other.

Each light emitting element ED may include a first end ED_P1 and a second end ED_P2. The first end ED_P1 may be an end on the side where the first semiconductor layer 31 is disposed with respect to the element active layer 33, and the second end ED_P2 may be an end on the side where the second semiconductor layer 32 is disposed with respect to the element active layer 33.

The plurality of light emitting elements ED may include a first light emitting element ED1 and a second light emitting element ED2. The first light emitting element ED1 may have the first end ED_P1 disposed on the second electrode 220 and the second end ED_P2 disposed on the first electrode 210. The second light emitting element ED2 may have the first end ED_P1 disposed on the first electrode 210 and the second end ED_P2 disposed on the second electrode 220. The first light emitting element ED1 and the second light emitting element ED2 may have the same configuration and structure, but alignment directions thereof between the first electrode 210 and the second electrode 220 may be opposite to each other.

The second insulating layer 520 may be disposed on the light emitting element ED. The second insulating layer 520 may be partially disposed on the light emitting element ED so as to expose both ends ED_P1 and ED_P2 of the light emitting element ED. The second insulating layer 520 may be disposed to partially surround the outer surface of the light emitting element ED, but not to cover the both ends ED_P1 and ED_P2 of the light emitting element ED.

The portion of the second insulating layer 520 disposed on the light emitting element ED may be arranged to extend in the fifth direction DR5 on the light emitting element ED on the first insulating layer 510 in a plan view, so that it may form a linear or island-like pattern in each pixel PX. The second insulating layer 520 may protect the light emitting element ED while fixing the light emitting element ED during the fabricating process of the display device 10. In addition, the second insulating layer 520 may be disposed to fill a space between the light emitting element ED and the first insulating layer 510 disposed therebelow.

The contact electrode 700 may be disposed on the second insulating layer 520. The contact electrode 700 may be disposed on the first insulating layer 510 on which the light emitting element ED is disposed. The contact electrode 700 may include the first contact electrode 710 and the second contact electrode 720 spaced from each other.

The first contact electrode 710 may be disposed on the first electrode 210 in the emission area EMA. The first contact electrode 710 may have a shape extending in the fifth direction DR5 above the first electrode 210. The first contact electrode 710 may be in contact with each of the first electrode 210 and one end of the light emitting element ED disposed above the first electrode 210. One ends of the light emitting elements ED disposed above the first electrode 210 may include the second end ED_P2 of the first light emitting element ED1 and the first end ED_P1 of the second light emitting element ED2.

The first contact electrode 710 may be in contact with the first electrode 210 exposed by the first contact portion CT1 penetrating the first insulating layer 510 in the sub-region SA, and may be in contact with one end of the light emitting element ED in the emission area EMA. That is, the first contact electrode 710 may serve to electrically connect the first electrode 210 to one end of the light emitting element ED.

The second contact electrode 720 may be disposed on the second electrode 220 in the emission area EMA. The second contact electrode 720 may have a shape extending in the fifth direction DR5 above the second electrode 220. The second contact electrode 720 may be in contact with each of the second electrode 220 and the other end of the light emitting element ED disposed above the second electrode 220. The other ends of the light emitting elements ED disposed above the second electrode 220 may include the first end ED_P1 of the first light emitting element ED1 and the second end ED_P2 of the second light emitting element ED2.

The second contact electrode 720 may be in contact with the second electrode 220 exposed by the second contact portion CT2 penetrating the first insulating layer 510 in the sub-region SA, and may be in contact with the other end of the light emitting element ED in the emission area EMA. That is, the second contact electrode 720 may serve to electrically connect the second electrode 220 to the other end of the light emitting element ED.

The first contact electrode 710 and the second contact electrode 720 may be spaced from each other on the light emitting element ED. For example, the first contact electrode 710 and the second contact electrode 720 may be spaced from each other with the second insulating layer 520 interposed therebetween. The first contact electrode 710 and the second contact electrode 720 may be electrically insulated from each other.

The first contact electrode 710 and the second contact electrode 720 may include the same material. For example, each of the first contact electrode 710 and the second contact electrode 720 may include a conductive material. For example, the first contact electrode 710 and the second contact electrode 720 may include ITO, IZO, ITZO, aluminum (Al), or the like. As one example, each of the first contact electrode 710 and the second contact electrode 720 may include a transparent conductive material. Because each of the first contact electrode 710 and the second contact electrode 720 includes a transparent conductive material, light emitted from the light emitting element ED may pass through the first contact electrode 710 and the second contact electrode 720 to travel toward the first electrode 210 and the second electrode 220, and may be reflected from the surfaces of the first electrode 210 and the second electrode 220.

The first contact electrode 710 and the second contact electrode 720 may include the same material and may be formed at the same layer. The first contact electrode 710 and the second contact electrode 720 may be concurrently (e.g., simultaneously) formed through the same step.

The third insulating layer 530 may be disposed on the contact electrode 700. The third insulating layer 530 may cover the light emitting element layer disposed thereunder. The third insulating layer 530 may cover the first bank 400, the electrode layer 200, the first insulating layer 510, the plurality of light emitting elements ED, the second insulating layer 520, and the contact electrode 700. The third insulating layer 530 may be disposed above the second bank 600 to also cover the second bank 600.

The third insulating layer 530 may serve to protect the light emitting element layer disposed thereunder from foreign substances such as dust particles, or moisture/oxygen. The third insulating layer 530 may serve to protect the first bank 400, the electrode layer 200, the first insulating layer 510, the plurality of light emitting elements ED, the second insulating layer 520, and the contact electrode 700.

Figure 25:
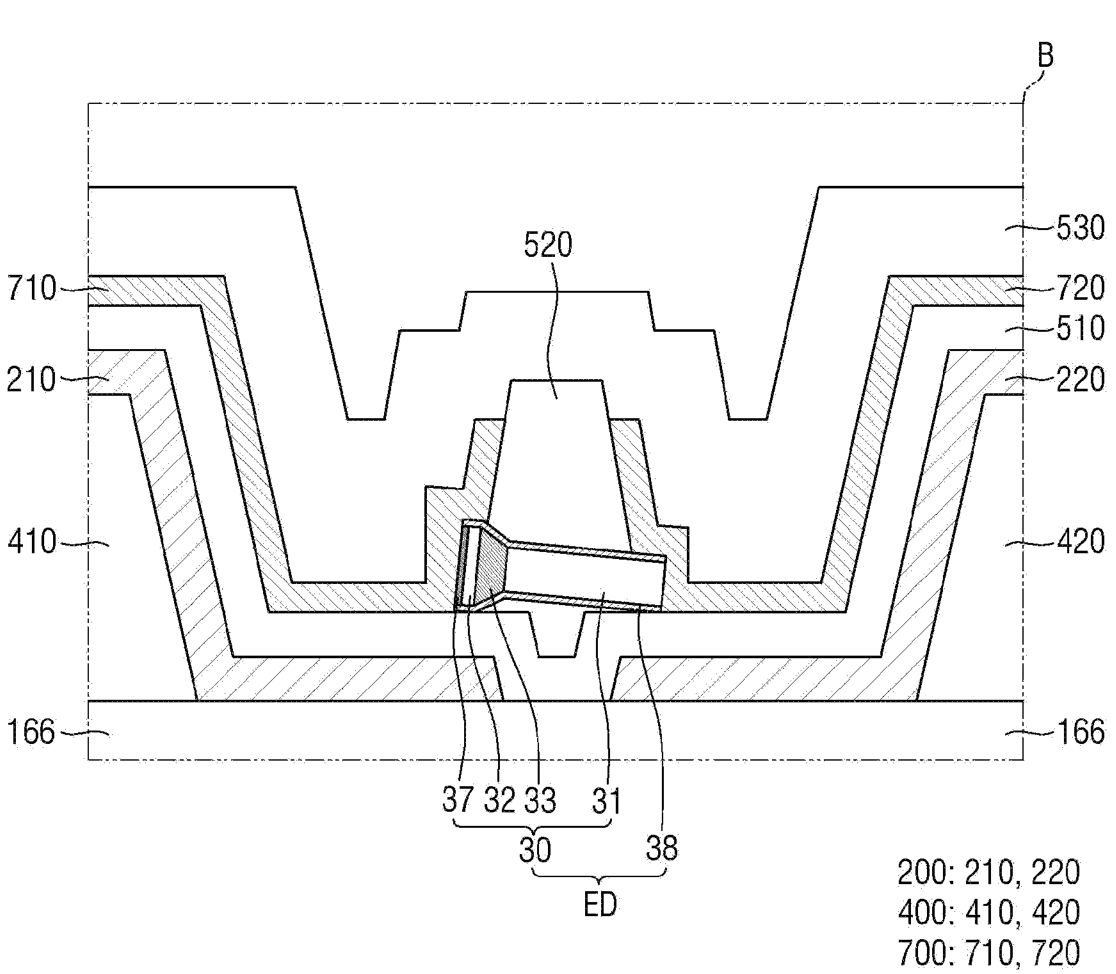
FIG. 25 is an enlarged cross-sectional view illustrating an example of an area B of FIG. 24, and shows a display device including the light emitting element of FIG. 1 according to one or more embodiments.

FIG. 25 is an enlarged cross-sectional view illustrating an example of an area B of FIG. 24, and shows a display device including the light emitting element of FIG. 1.

Referring to FIG. 25, the display device 10 according to the present embodiment may include the light emitting element ED of FIG. 1. The plurality of semiconductor layers included in the light emitting element ED may be sequentially arranged between the first electrode 210 and the second electrode 220 along a direction in which the first electrode 210 and the second electrode 220 are spaced from each other.

In one or more embodiments, as the light emitting element ED includes the element active layer 33 whose diameter increases from the first semiconductor layer 31 to the second semiconductor layer 32, the diameters of both ends of the light emitting element ED may be different from each other. As described above, as one end of the light emitting element ED and the other end of the light emitting element ED are formed to have different diameters, the longitudinal direction of the light emitting element ED may be inclined with respect to one surface of the via layer 166. As the light emitting element ED is aligned between the first electrode 210 and the second electrode 220 such that the longitudinal direction of the light emitting element ED is inclined with respect to one surface of the via layer 166 (or one surface of the substrate SUB), boundary surfaces between the first semiconductor layer 31, the element active layer 33, and the second semiconductor layer 32 may be inclined with respect to one surface of the via layer 166 (or one surface of the substrate SUB).

The second insulating layer 520 may be disposed on the light emitting element ED. The second insulating layer 520 may be disposed to be around (or surround) the outer surface (e.g., the outer peripheral or circumferential surface) of the light emitting element ED. The second insulating layer 520 may be disposed on the element insulating film 38 of the light emitting element ED and may be around (or surround) the outer surface (e.g., the outer peripheral or circumferential surface) of the element insulating film 38 of the light emitting element ED facing a display direction DR6.

In a region where the light emitting element ED is disposed, the second insulating layer 520 may be disposed to be around (or surround) the outer surface (specifically, the element insulating film 38) of the light emitting element ED, and in a region where the light emitting element ED is not disposed, the second insulating layer 520 may be disposed on the first insulating layer 510 exposed by the light emitting element ED.

The first contact electrode 710 may be in contact with one end of the light emitting element ED exposed by the second insulating layer 520. For example, the first contact electrode 710 may be disposed to be around (or surround) one end surface of the light emitting element ED exposed by the second insulating layer 520. The first contact electrode 710 may be in contact with element electrode layer 37 and the element insulating film 38 of the light emitting element ED.

The second contact electrode 720 may be in contact with the other end of the light emitting element ED exposed by the second insulating layer 520. For example, the second contact electrode 720 may be disposed to be around (or surround) the other end surface of the light emitting element ED exposed by the second insulating layer 520. The second contact electrode 720 may be in contact with the first semiconductor layer 31 and the element insulating film 38 of the light emitting element ED.

The first contact electrode 710 and the second contact electrode 720 may be spaced from each other with the second insulating layer 520 interposed therebetween. The first contact electrode 710 and the second contact electrode 720 may expose at least a part of the top surface of the second insulating layer 520.

The first contact electrode 710 and the second contact electrode 720 may be formed at the same layer and may contain the same material. That is, the first contact electrode 710 and the second contact electrode 720 may be formed concurrently (e.g., simultaneously) by one mask process. Therefore, no additional mask process for forming the first contact electrode 710 and the second contact electrode 720 is required, which makes it possible to improve the efficiency of the manufacturing process of the display device 10.

Figure 26:
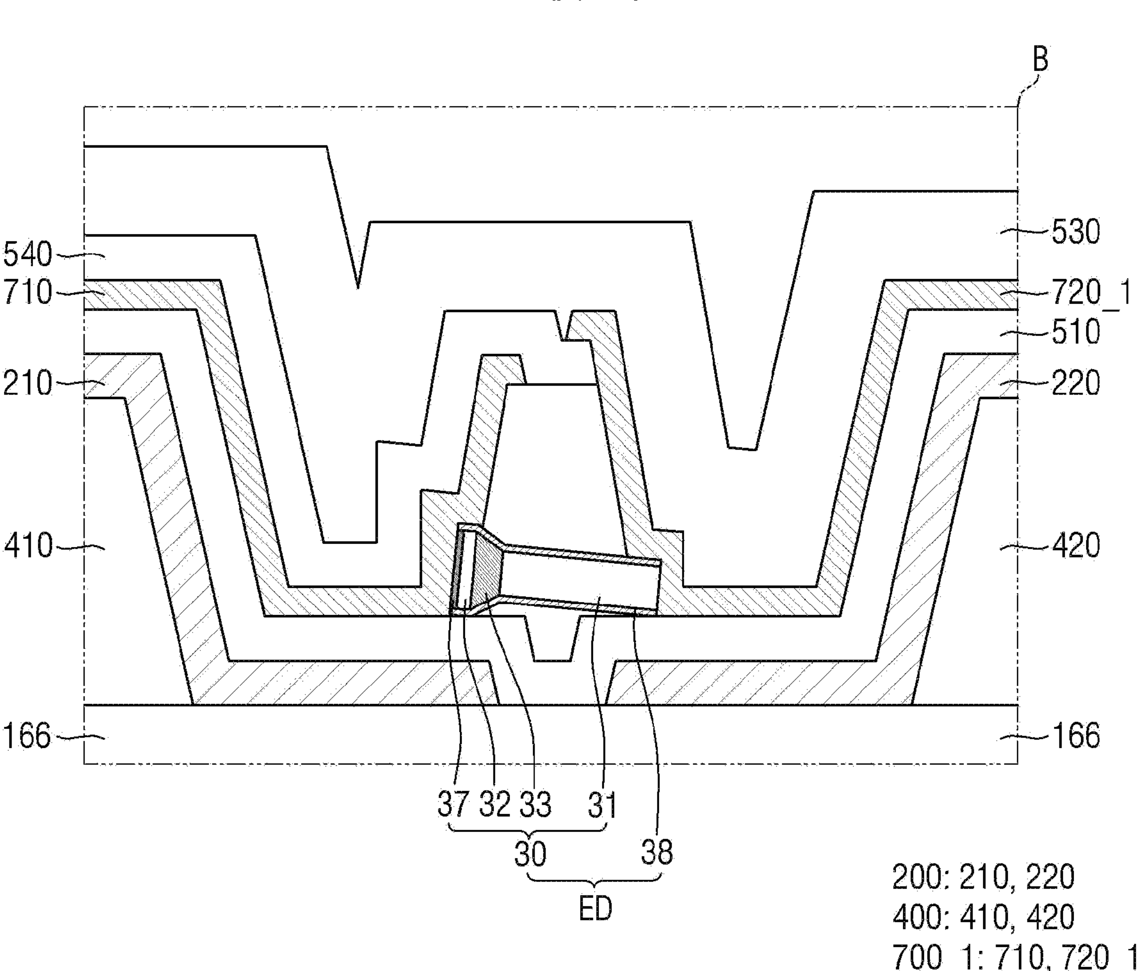
FIG. 26 is an enlarged cross-sectional view illustrating another example of the area B of FIG. 24, and shows a display device including the light emitting element of FIG. 1 according to one or more embodiments.

FIG. 26 is an enlarged cross-sectional view illustrating an example of the area B of FIG. 24, and shows a display device including the light emitting element of FIG. 1 according to one or more embodiments.

Referring to FIG. 26, the display device 10 according to the present embodiment is different from that in the embodiment of FIG. 25 in that a contact electrode 700_1 includes the first contact electrode 710 and a second contact electrode 720_1 that are formed on different layers, and a fourth insulating layer 540 is further included.

For example, a contact electrode 700_1 may include the first contact electrode 710 and the second contact electrode 720_1 that are formed at different layers.

The first contact electrode 710 may be disposed on the first electrode 210 and one end of the light emitting element ED. The first contact electrode 710 may extend from one end of the light emitting element ED toward the second insulating layer 520 to be disposed on one sidewall of the second insulating layer 520 and the top surface of the second insulating layer 520. The first contact electrode 710 may be disposed on the top surface of the second insulating layer 520 while at least partially exposing the top surface of the second insulating layer 520.

The fourth insulating layer 540 may be disposed on the first contact electrode 710. The fourth insulating layer 540 may be disposed to completely cover the first contact electrode 710. The fourth insulating layer 540 may be disposed to completely cover the one sidewall and the top surface of the second insulating layer 520, without being disposed on the other sidewall of the second insulating layer 520. One end of the fourth insulating layer 540 may be aligned with the other sidewall of the second insulating layer 520.

The second contact electrode 720_1 may be disposed on the second electrode 220 and the other end of the light emitting element ED. The second contact electrode 720_1 may extend from the other end of the light emitting element ED toward the second insulating layer 520 to be disposed on the other sidewall of the second insulating layer 520 and the top surface of the fourth insulating layer 540.

The third insulating layer 530 may be disposed on the fourth insulating layer 540 and the second contact electrode 720_1. The third insulating layer 530 may be disposed on the fourth insulating layer 540 and the second contact electrode 720_1 to cover them.

In the present embodiment, by forming the first contact electrode 710 and the second contact electrode 720_1 in different layers and interposing the fourth insulating layer 540 therebetween, a process of manufacturing the display device 10 may be additionally performed. Therefore, the manufacturing process efficiency of the display device 10 may be reduced, but the reliability of the display device 10 may be improved. For example, in the manufacturing process of the display device 10, by forming the first contact electrode 710 and the second contact electrode 720_1 in different layers and further providing the fourth insulating layer 540 therebetween, a problem in which the first contact electrode 710 and the second contact electrode 720_1 are short-circuited may be prevented or minimized.

Figure 27:
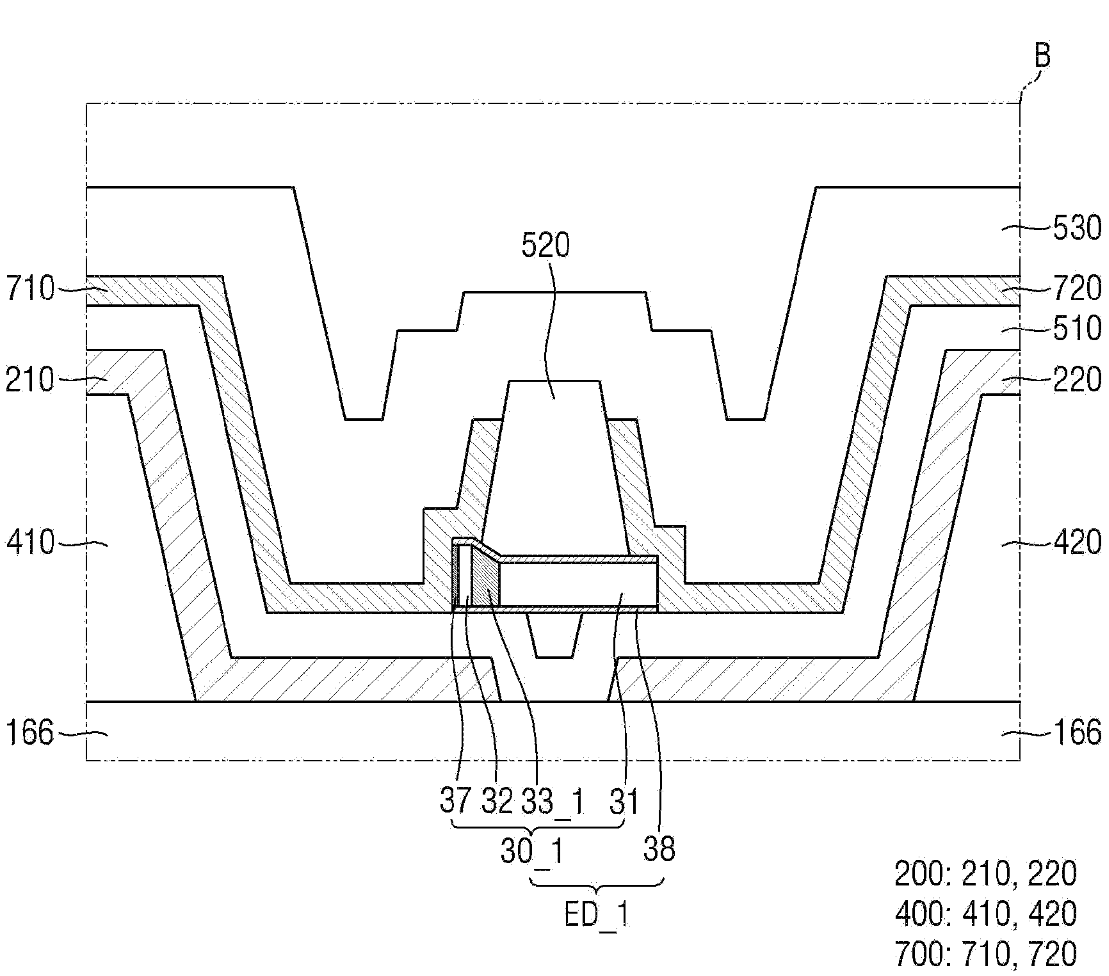
FIG. 27 is an enlarged cross-sectional view illustrating an example of the area B of FIG. 24, and shows a display device including the light emitting element of FIG. 15 according to one or more embodiments.

FIG. 27 is an enlarged cross-sectional view illustrating an example of the area B of FIG. 24, and shows a display device including the light emitting element of FIG. 15 according to one or more embodiments.

Referring to FIG. 27, the display device 10 according to the present embodiment may include the light emitting element ED_1 of FIG. 15. The plurality of semiconductor layers included in the light emitting element ED_1 may be sequentially arranged between the first electrode 210 and the second electrode 220 along a direction in which the first electrode 210 and the second electrode 220 are spaced from each other.

In the light emitting element ED_1 according to the present embodiment, a lower side facing the via layer 166 and an upper side facing the second insulating layer 520 may have an asymmetric relationship in a cross-sectional view taken along the longitudinal direction of the light emitting element ED_1. Boundary surfaces between the first semiconductor layer 31, the element active layer 33, and the second semiconductor layer 32 may be perpendicular to one surface of the via layer 166 (or one surface of the substrate SUB).

However, the aspects and features of embodiments of the present disclosure are not restricted to those explicitly set forth herein. The above and other aspects and features of embodiments of the present disclosure will become more apparent to one of daily skill in the art to which the present disclosure pertains by referencing the claims, with equivalents thereof to be included therein.

What is claimed is:

1. A light emitting element, comprising:
- a first semiconductor layer;
- a second semiconductor layer on the first semiconductor layer; and
- an element active layer between the first semiconductor layer and the second semiconductor layer,
- wherein the first semiconductor layer, the element active layer, and the second semiconductor layer are sequentially located along a first direction,
- a thickness of the first semiconductor layer in the first direction is greater than a thickness of the second semiconductor layer in the first direction, and
- a cross section of the element active layer taken along the first direction comprises:
  - a first side facing the first semiconductor layer;
  - a second side facing the second semiconductor layer;
  - a first lateral side connecting one end of the first side to one end of the second side; and
  - a second lateral side connecting an other end of the first side to an other end of the second side,
  - wherein a length of the second side is greater than a length of the first side,
  - wherein an exterior angle between the first side and the first lateral side is in a range of 55° to 75°,
  - wherein a first cross sectional size of the first semiconductor layer is substantially uniform along the first direction and a second cross sectional size of the second semiconductor layer is substantially uniform along the first direction, and
  - wherein a width of the first semiconductor layer in a second direction crossing the first direction is smaller than a width of the second semiconductor layer in the second direction.

2. The light emitting element of claim 1, wherein an exterior angle between the first side and the second lateral side is in a range of 55° to 75°.

3. The light emitting element of claim 2, wherein the exterior angle between the first side and the first lateral side is in a range of 60° to 73°, and
- wherein the exterior angle between the first side and the second lateral side is in a range of 60° to 73°.

4. The light emitting element of claim 2, wherein the exterior angle between the first side and the first lateral side and the exterior angle between the first side and the second lateral side are the same.

5. The light emitting element of claim 1, wherein each of the first lateral side and the second lateral side is inclined with respect to the first side, and
- wherein a direction in which the first lateral side is inclined and a direction in which the second lateral side is inclined are opposite to each other.

6. The light emitting element of claim 1, wherein the cross section of the element active layer is asymmetrical with respect to a reference line extending in the first direction passing through a central portion of the element active layer.

7. The light emitting element of claim 6, wherein the first side and the second lateral side are perpendicular to each other.

8. The light emitting element of claim 1, wherein the thickness of the first semiconductor layer in the first direction is greater than a thickness of the element active layer in the first direction.

9. The light emitting element of claim 8, wherein the thickness of the first semiconductor layer in the first direction is greater than a sum of the thickness of the element active layer in the first direction and the thickness of the second semiconductor layer in the first direction.

10. A display device comprising:
- a first electrode and a second electrode on a substrate and spaced from each other; and
- a light emitting element between the first electrode and the second electrode and extending in a first direction,
- wherein the light emitting element comprises:
  - a first semiconductor layer;
  - a second semiconductor layer on the first semiconductor layer; and
  - an element active layer between the first semiconductor layer and the second semiconductor layer,
  - wherein the first semiconductor layer, the element active layer, and the second semiconductor layer are sequentially located along the first direction,
  - wherein a thickness of the first semiconductor layer in the first direction is greater than a thickness of the second semiconductor layer in the first direction, and
  - wherein a cross section of the element active layer taken along the first direction comprises:
    - a first side facing the first semiconductor layer;
    - a second side facing the second semiconductor layer;
    - a first lateral side connecting one end of the first side to one end of the second side; and
    - a second lateral side connecting an other end of the first side to an other end of the second side,
    - wherein a length of the second side is greater than a length of the first side,
    - wherein an exterior angle between the first side and the first lateral side or the second lateral side is in a range of 55° to 75°,
    - wherein a first cross sectional size of the first semiconductor layer is substantially uniform along the first direction and a second cross sectional size of the second semiconductor layer is substantially uniform along the first direction, and
    - wherein a width of the first semiconductor layer in a second direction crossing the first direction is smaller than a width of the second semiconductor layer in the second direction.

11. The display device of claim 10, wherein each of the first lateral side and the second lateral side is inclined with respect to the first side, and
- wherein a direction in which the first lateral side is inclined and a direction in which the second lateral side is inclined are opposite to each other.

12. The display device of claim 10, wherein the cross section of the element active layer is asymmetrical with respect to a reference line extending in the first direction passing through a central portion of the element active layer.

13. The display device of claim 12, wherein the first side and the second lateral side are perpendicular to each other.

* * * * *